United States Patent
Takemura et al.

(10) Patent No.: US 6,671,217 B2
(45) Date of Patent: Dec. 30, 2003

(54) SEMICONDUCTOR DEVICE USING HIGH-SPEED SENSE AMPLIFIER

(75) Inventors: Riichiro Takemura, Tokyo (JP); Tomonori Sekiguchi, Zurich (CH); Takeshi Sakata, Hino (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/361,697

(22) Filed: Feb. 11, 2003

(65) Prior Publication Data

US 2003/0168703 A1 Sep. 11, 2003

(30) Foreign Application Priority Data

Mar. 5, 2002  (JP) ..................... P2002-058154

(51) Int. Cl.[7] .................................................. G11C 7/00
(52) U.S. Cl. ...................... 365/205; 365/207; 365/202; 365/196; 365/226
(58) Field of Search ................. 365/205, 207, 365/202, 196, 226

(56) References Cited

U.S. PATENT DOCUMENTS

| 5,029,137 A | 7/1991 | Hoshi | |
|---|---|---|---|
| 5,217,917 A | * 6/1993 | Takahashi et al. | 365/72 |
| 5,412,605 A | 5/1995 | Ooishi | |
| 5,426,613 A | * 6/1995 | Takahashi et al. | 365/222 |
| 5,805,513 A | * 9/1998 | Takahashi et al. | 365/201 |
| 6,212,110 B1 | 4/2001 | Sakamoto et al. | |
| 2001/0000408 A1 | * 11/2001 | Fujisawa et al. | 365/226 |
| 2002/0000624 A1 | 1/2002 | Takemura et al. | |

FOREIGN PATENT DOCUMENTS

| EP | 1164595 | 12/2001 |
|---|---|---|
| JP | 02-146177 | 11/1988 |
| JP | 2000243085 | 9/2000 |

* cited by examiner

Primary Examiner—Viet Q. Nguyen

(57) ABSTRACT

A sense amplifier arrangement that achieves high-speed access and shorter cycle time when array voltage is lowered in a DRAM. In a TG clocking sense system to separate data lines between the array side and the sense amplifier side in an early stage of a sensing period, a restore amplifier RAP is added, which amplifies data lines on the array side by referring to the data in the sense amplifier, and the restore amplifier is driven by a voltage VDH higher than the array voltage VDL. As a result, high-speed sense operation of the TG clocking system is made compatible with high-speed restore operation of overdrive system, and it is possible to achieve high-speed access operation and shorter cycle time.

11 Claims, 18 Drawing Sheets

F I G. 4
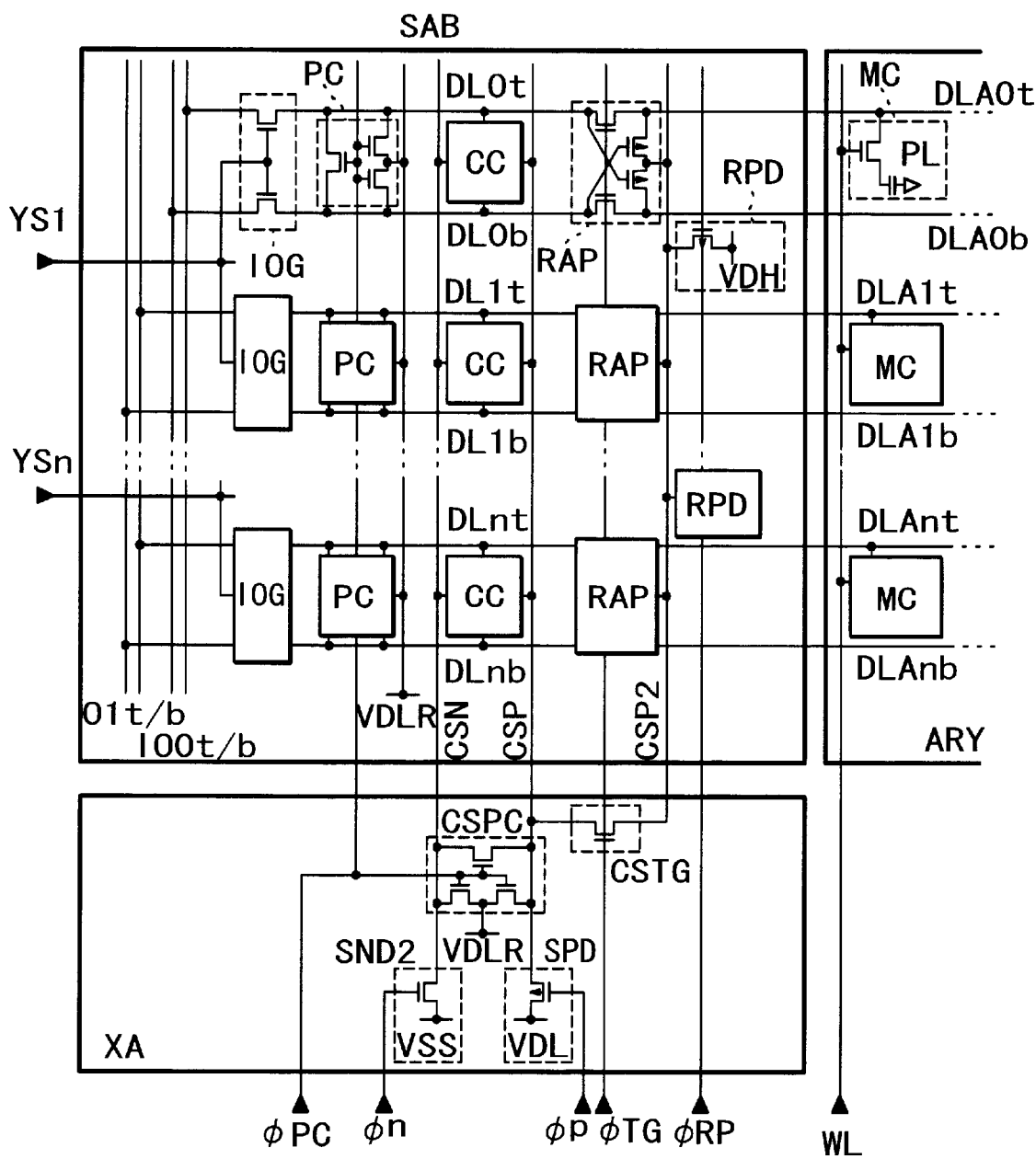

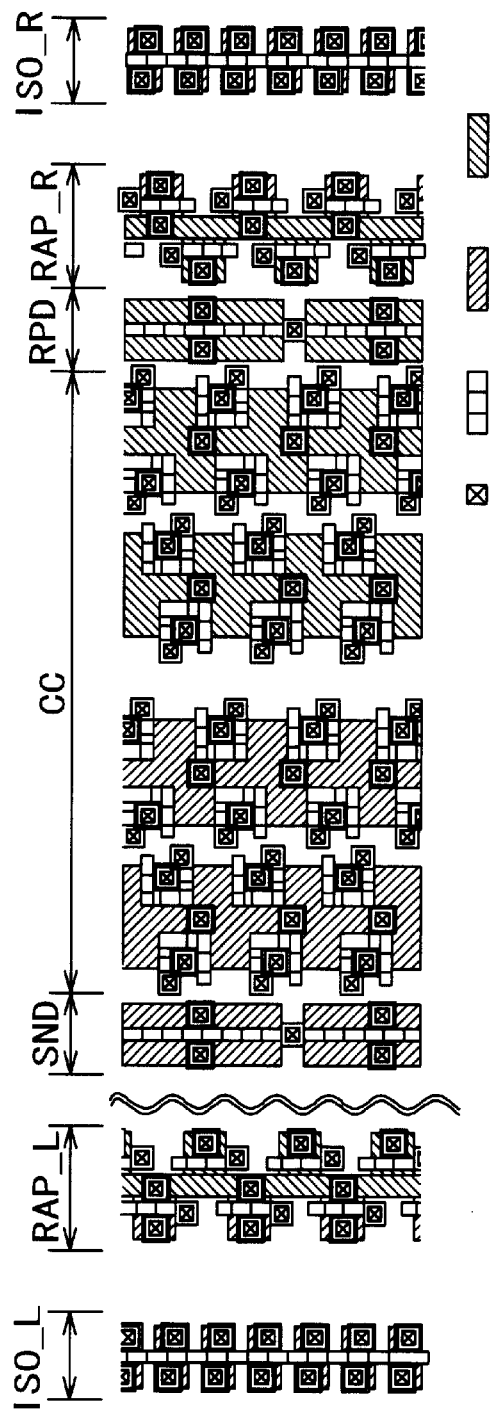
F I G. 6 A
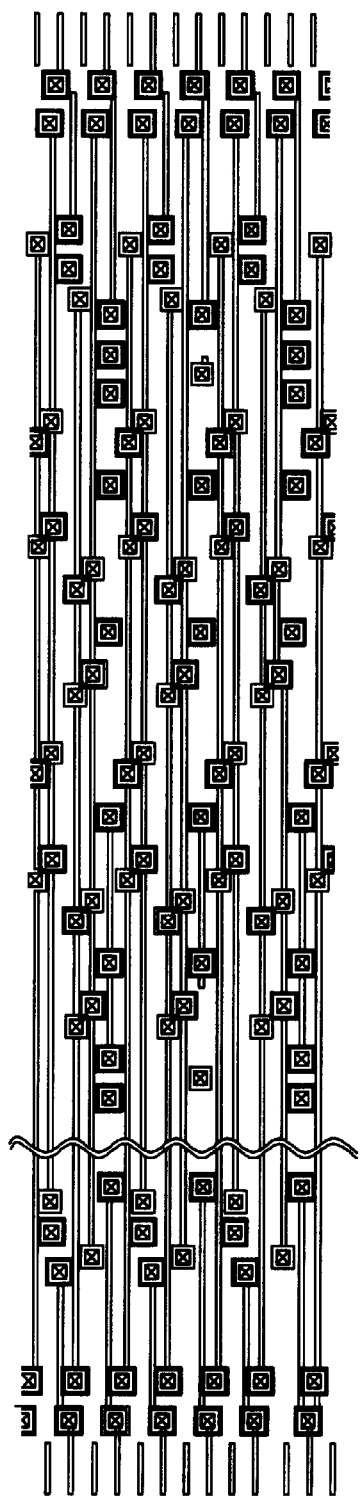
F I G. 6 B

F I G. 1 6
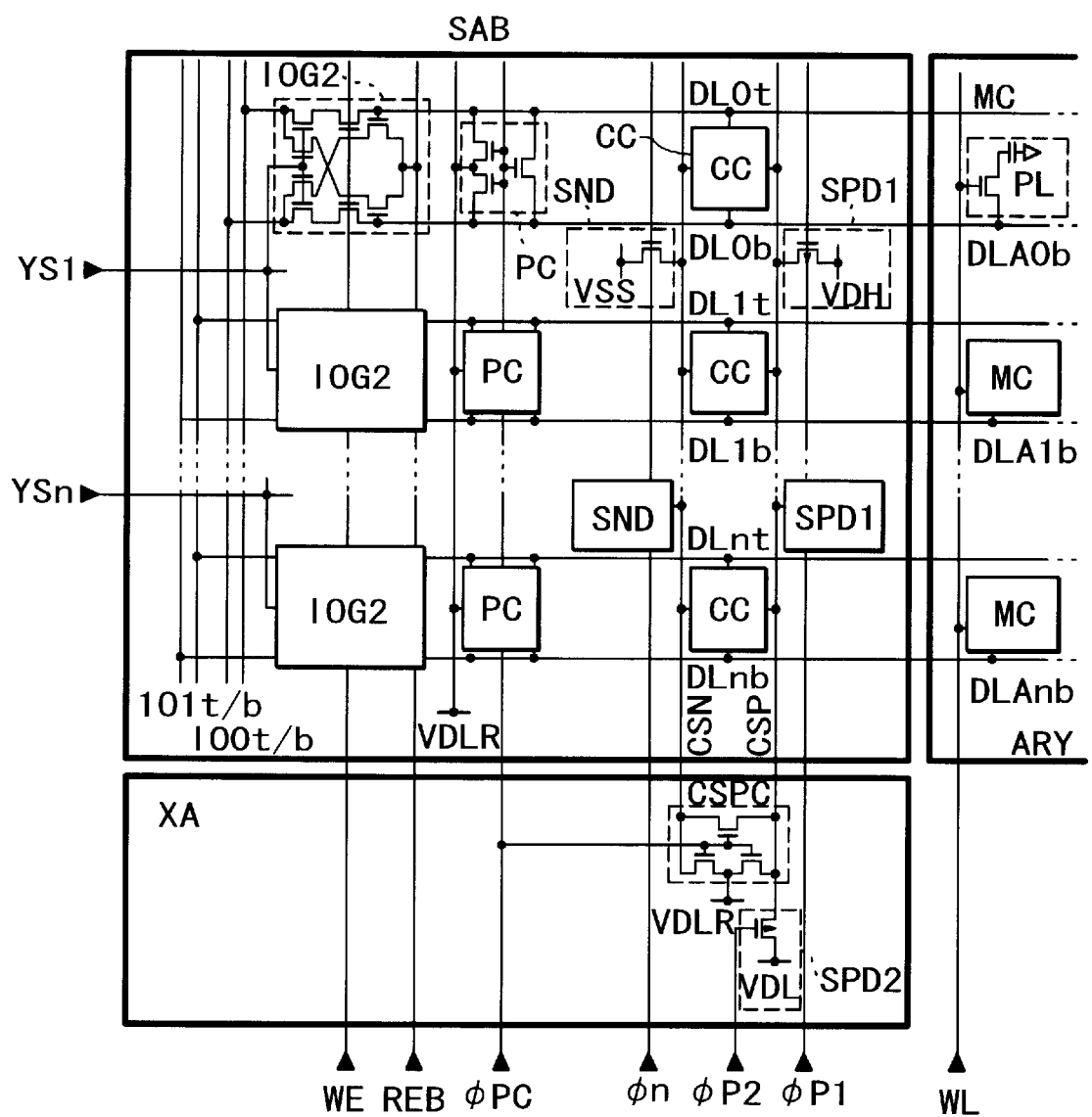

SEMICONDUCTOR DEVICE USING HIGH-SPEED SENSE AMPLIFIER

BACKGROUND OF THE INVENTION

1. Field of the Invention

The present invention relates to a semiconductor device, and in particular, the invention relates to an arrangement of a differential amplifier circuit of a semiconductor device and a system of its operation.

2. Description of the Related Art

The following is a list of references referred in this specification. The references should be referred by reference numbers: Reference 1: JP-A No. 146177/1990; Reference 2: U.S. Pat. No. 5,412,605.

Reference 1 discloses a transfer gate (TG) clocking system with restore assist to improve restore operation of the TG clocking system and allow it to perform high speed amplification of data lines in a sense amplifier by separating the data line in the sense amplifier from the data line on the memory array side for a given period of time in the early stage of sense operation. The data lines on the array side are amplified according to the voltage of the data lines on the sense amplifier side at the same time as the data lines on the sense amplifier side are amplified.

Reference 2 discloses an overdrive system to improve transistor driving power at low voltage. According to this system, a voltage higher than final amplitude voltage is applied on source nodes of a CMOS sense amplifier for a given period of time in the early stage of sense operation.

In a dynamic random access memory (DRAM), a circuit (sense amplifier) for amplifying micro voltage difference, Δ V, between data line pairs generated by read-out operation to data line amplitude is connected to each of the data line pairs. Normally, as the sense amplifier, a cross couple type differential amplifier circuit comprising two transistors with different polarities is used. For instance, when a cross couple type differential amplifier circuit comprising a metal insulating film semiconductor or a metal oxide semiconductor (MOS) is used as the sense amplifier, N-type MOS (NMOS) and P-type MOS (PMOS) transistors are connected in series between the data lines respectively, and a source is commonly used for NMOS transistors and PMOS transistors. The gate is connected to a data line different from that of the drain.

In the sense amplifier, positive feedback amplification is performed according to the micro potential difference generated by the data read out from the memory cell selected by a word line, and one of the data line pairs is amplified to low level, and the other is amplified to high level. However, in DRAMs, a half-precharge system is typically used, which precharges the data line to one-half of amplitude voltage. During activation of the sense amplifier, only about ½ of the power source amplitude is applied between source and drain and between gate and source of the transistors. For this reason, compared with the peripheral circuit, operating speed is rapidly decreased when power source voltage is decreased. Also, there is a problem in the increase of the operating current when the sense amplifier is operated. When the number of the sense amplifiers operated at the same time is increased, voltage drop at the power source wiring that supplies power to the sense amplifier is increased. As a result, the voltage applied on the sense amplifier is decreased, and the operating speed is decreased further.

In DRAMs, it is desirable to achieve low power consumption, low voltage, and high-speed operation. In particular, it is desirable to reduce access time, i.e., the time from the command input to the output of data, and also to decrease the cycle time to determine random access time. When the sense speed is decreased due to low voltage, more time is required to output the data to outside from the sense amplifier, and this leads to the increase of access time. Further, in DRAM, it is necessary to rewrite (restore) the data once read out to the memory cell for destructive read-out. This restore operation may be slower compared with the sense operation, while high-speed operation is desirable to determine the cycle time of the DRAM. When it is turned to low voltage, charge/discharge operation of the data line is delayed. This results in the increase of the restore time, in the increase of cycle time, and in the deterioration of random access performance characteristics. Therefore, to decrease access time and cycle time of DRAM during low voltage, it is essential to reduce the sense time and the restore time of the sense amplifier.

As the sense system at low voltage, the overdrive system of Reference 2 is known. At low voltage of 1 V, charge and discharge are performed at the same time on the data lines in the sense amplifier and in the array, and the restore time is extensively reduced, but the decrease of the sense time is not sufficient.

On the other hand, as a technique to decrease only the sense time, a TG clocking system is proposed. However, the restore operation is performed after amplification in the sense amplifier, and the restore time is increased. For this reason, a TG clocking system with restore assist by modifying the restore operation of TG clocking system of Reference 1 has been proposed. However, even in this system, it is difficult to achieve high-speed restore operation under low voltage. FIG. 19 represents the results of simulation, showing the relation between the restore time RSTIME (ns) required for writing up to 90% to the storage nodes of the memory cell and the array voltage VDL (V). Restore time of a TG clocking system and restore time of a conventional type TG clocking system with the conventional type restore assist are shown in (c) and (b) respectively. In the TG clocking system added with restore amplifier, the restore time of the 'H' side data to the memory cell is rapidly increased when it is turned to low voltage. In particular, when the array voltage VDL is 1.2 V or less, the restore time exceeds 25 ns, and the cycle time of the array is greater than 55 ns. This is because the restore amplifier and the sense amplifier are driven by the same power source. As a result, voltage drop occurs due to resistance of the power source wiring. Amplitude of the data line on the array side is decreased, and the charge stored in the memory cell is decreased. When the writing voltage of the data on the 'H' side is decreased, data holding time is shortened, which is a problem specific to DRAM. If the refresh operation is frequently performed to compensate for this, power consumption is increased. Also, the amplitude of the power source used for the amplifying operation in the sense amplifier is decreased, and this leads to an increase in the access time. For this reason, it is desired to have a sense system where both high-speed sense operation and high-speed restore operation can be performed at the same time.

SUMMARY OF THE INVENTION

The present invention provides a sense amplifier arrangement where both a high-speed sense operation and a high-speed restore operation can be performed simultaneously in a DRAM operated at low voltage to achieve high-speed access and shorter cycle time.

In carrying out the invention, one preferred aspect resides in the constitution where the power source of the sense amplifier for external data output is separated from the power source of the restore amplifier to rewrite to the memory cell. This prevents the changes in the power source of the sense amplifier for external data output.

Another preferred aspect of the present invention resides in the constitution where the wiring on the array is utilized and the drivers are dispersedly arranged. This allows power source resistance of the restore amplifier to be decreased, and the restore time to be reduced by temporarily driving at high voltage.

Other and further objects, features and advantages of the invention will appear more fully from the following description.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 4 shows a variation of the first preferred embodiment of the present invention;

FIGS. 6A and 6B each represent a part of a layout drawing of the circuit shown in FIG. 13;

FIG. 16 is a block diagram of a sense amplifier block and its peripheral circuits in a third preferred embodiment of the present invention;

DESCRIPTION OF THE INVENTION

Figure 1:
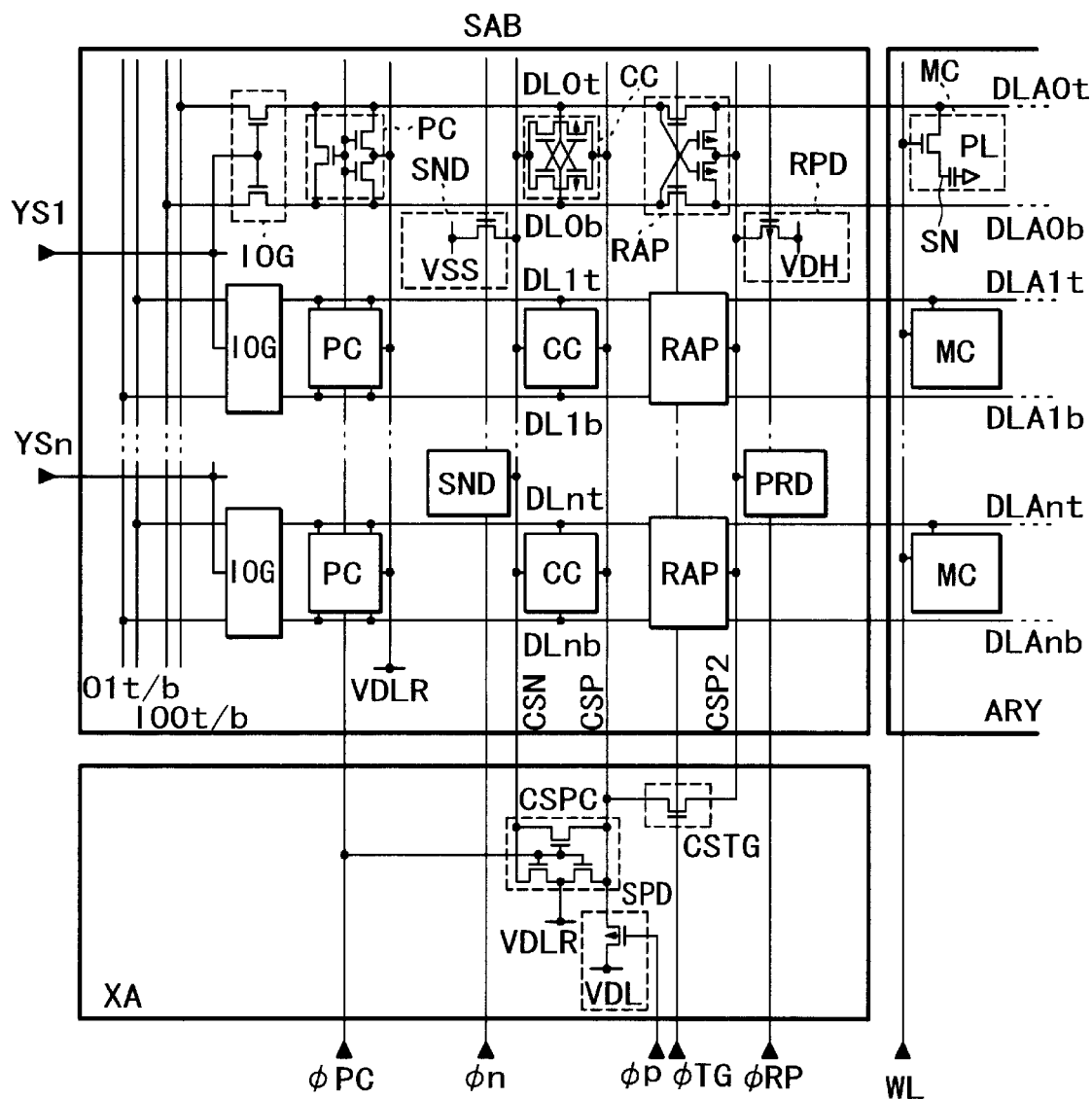
FIG. 1 is a block diagram of a sense amplifier block and its peripheral circuits of a first preferred embodiment of the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description of the present invention and the preferred embodiment(s) thereof is set forth in detail below with reference to the attached drawings.

Detailed description will be given below on embodiments of the present invention referring to the drawings. Circuit elements constituting each block in the preferred embodiments are formed on a semiconductor substrate such as a monocrystal silicon substrate using an integrated circuit technique such as CMOS (complementary MIS transistor) already known in the art. In the circuit of MISFET (Metal Insulator Semiconductor Field Effect Transistor), a circuit symbol without arrow denotes an N-channel type MISFET (NMOS transistor), and it is discriminated from a P-channel MISFET (PMOS transistor) represented by a symbol with arrow. In the following description, MISFET is simply referred as MOS. In the present invention, similar effects can be provided in an open type data line arrangement or in a folded type data line arrangement as a memory array arrangement, and the present invention is not limited to the data line arrangement. Description will be given below on the present invention in the folded type data line arrangement.

A first preferred embodiment of the present invention is described below with reference to FIG. 1. FIG. 1 partially shows a DRAM memory array ARY and its peripheral circuit blocks, i.e., a sense amplifier block SAB and a cross area XA. In the sense amplifier SAB, the following circuits are connected to data line pairs of DL0$t$, DL0$b$, DL1$t$, DL1$b$, ... DL$n$t, DL$n$b: Cross couple circuit CC, TG restore amplifier unit RAP, which comprises a transfer gate separating the data lines on the sense amplifier side from the data lines of the memory array side and a PMOS transistor restore circuit, IO gate circuit IOG, and precharge circuit PC. Also, via TG restore amplifier unit, data lines DL0$t$, DL1$t$ ... DL$n$t are connected to the data lines on the array side, i.e. DLA0$t$, DLA1$t$ ... DLA$n$t, and data lines DL0$b$, DL1$b$ ... DL$n$b are connected to data lines on the array side, i.e. DLA0$b$, DLA1$b$ ... DLA$n$b.

Figure 2:
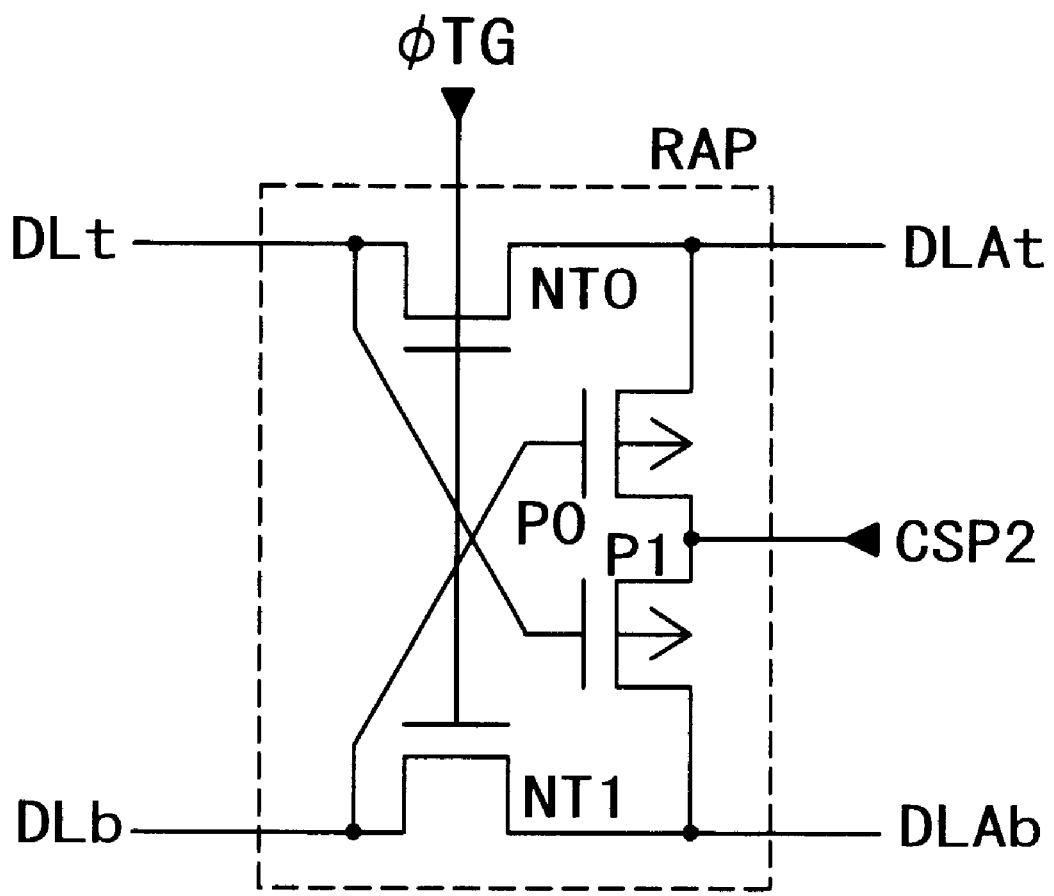
FIG. 2 is a diagram showing a restore amplifier used in the first preferred embodiment of the present invention.
Figure 11:
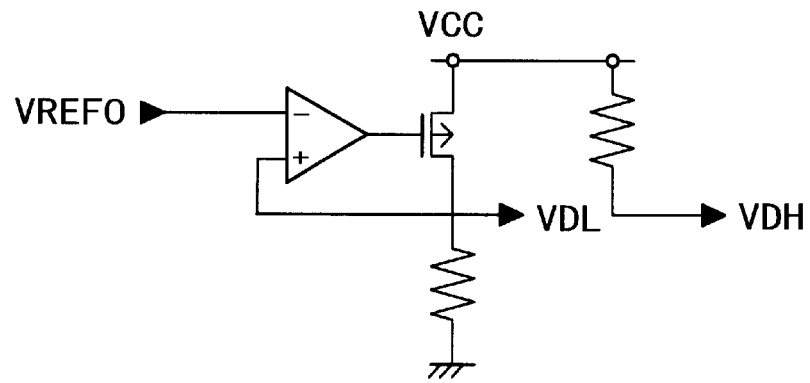
FIG. 11 is a diagram showing an internal voltage generating circuit of the present invention.
Figure 12:
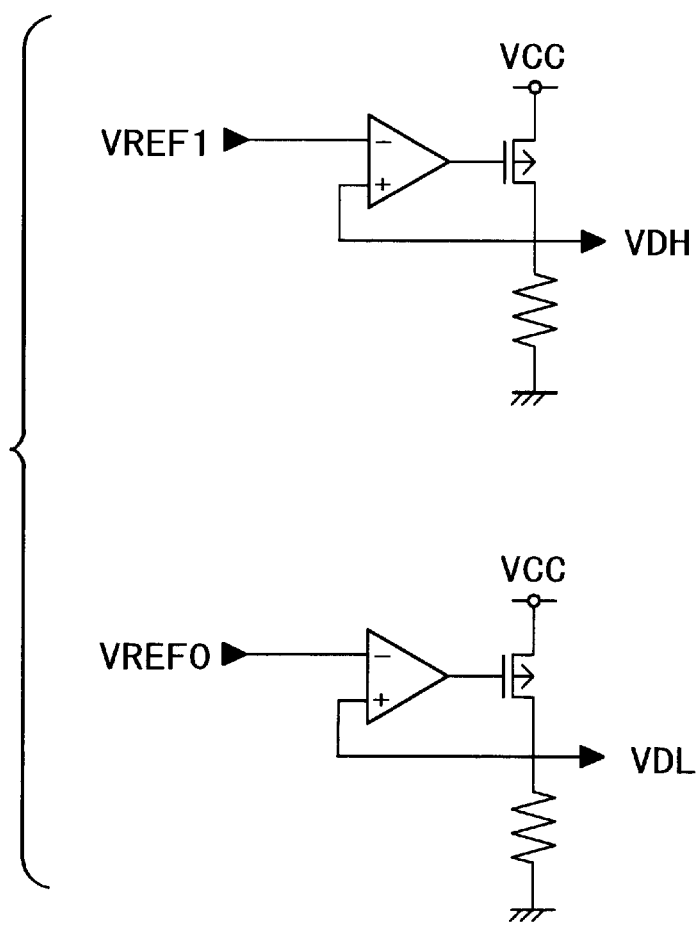
FIG. 12 comprises two diagrams each representing an internal voltage generating circuit of the present invention.
Figure 15:
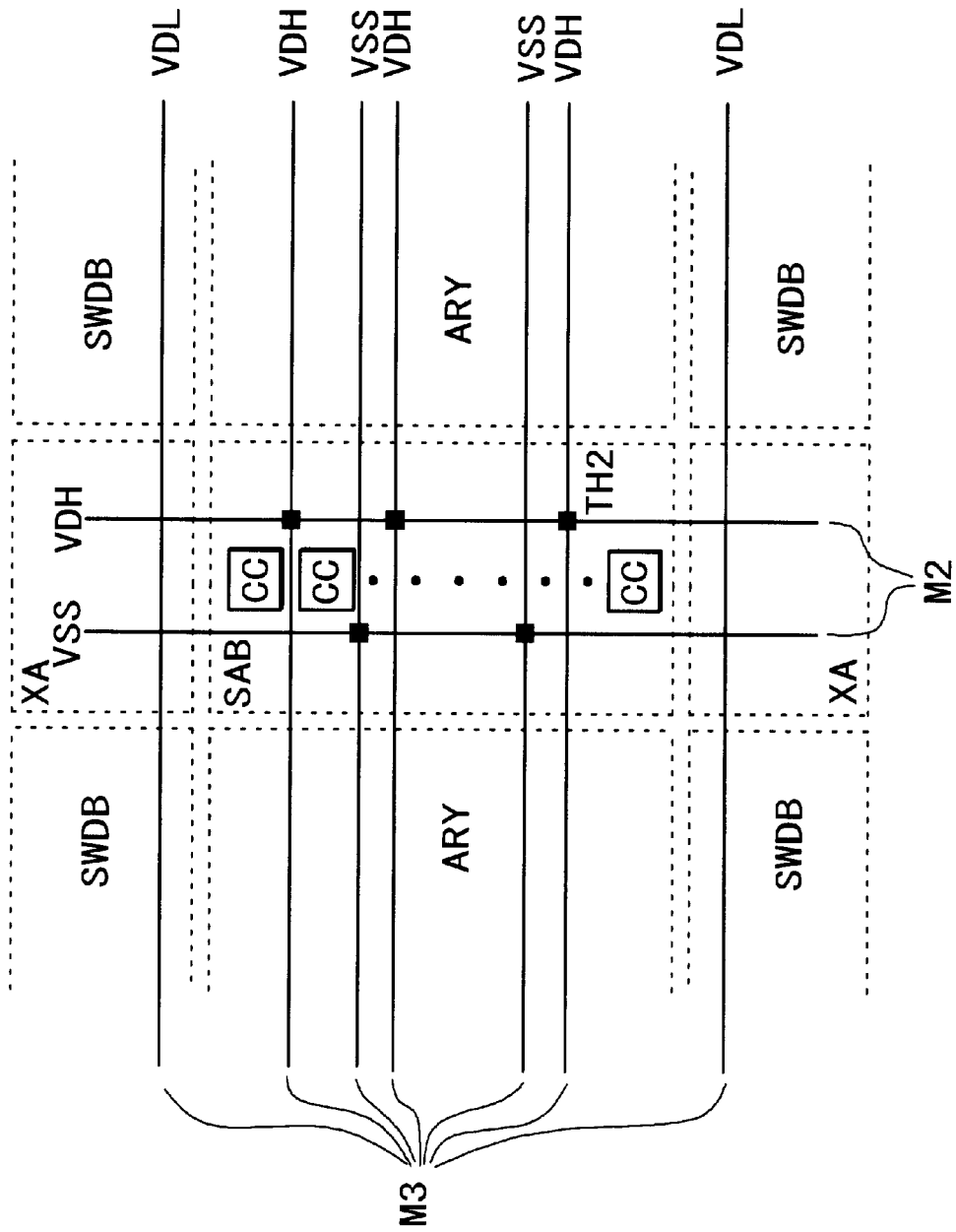
FIG. 15 is a diagram of power source wiring on a memory array.

The cross couple CC is a circuit for amplifying the data lines DL0$t$, DL0$b$, DL1$t$, DL1$b$ ... up to a voltage level as desired. It comprises a pair of NMOS transistors, which have a common source and have gate and drain connected with each other, and a pair of PMOS transistors, which have a common source and have gate and drain connected with each other. NMOS transistor source line CSN of the cross couple CC is driven to voltage level VSS, i.e. data line 'L' data level, from NMOS transistor sense amplifier drivers SND, which are arranged in a large number in the sense amplifier block SAB by a sense amplifier activation signal φn. Similarly, PMOS transistor common source line CSP is driven to array voltage VDL, i.e. data line amplitude voltage, from PMOS transistor sense drivers SPD arranged in the cross area XA, which is an intersection of sub-word driver SWD and the sense amplifier block SAB, by a sense amplifier activation signal φ p. A common source precharge circuit (CSPC) is connected to common sense lines CSN and CSP in the cross area XA. When common sense lines CSN and CSP are not selected, they are set to the same level as the data line; in this case, to data line precharge level VDLR (VDL/2), which is ½ of the array voltage VDL. FIG. 2 is a diagram showing detailed arrangement of the TG restore amplifier RAP. NMOS transistors NT0 and NT1 are switches, which are connected respectively between the sense amplifier side data lines DLt and DLb and between the array side data lines DLAt and DLAb, respectively. By a control signal φ TG, data lines on the array side and on the sense amplifier side are separated from each other for a given period of time in the early stage of sense operation. Although not shown in FIG. 1, this switch can be commonly used as a switch to select the connection of the memory array with the sense amplifier when the sense amplifier block SAB is commonly owned by the memory arrays ARY at left and right. PMOS transistors P0 and P1 make up a restore amplifier, which senses potential difference between the data lines DLt and DLb on the sense amplifier side and amplifies either of the data lines DLAt or DLAb on the array side toward the voltage level to drive a PMOS transistor restore amplifier common source line CSP2. The PMOS transistor restore amplifier common source line CSP2 is driven at voltage VDH higher than the data line amplitude voltage VDL for a given period of time in the initial stage of sense operation by PMOS transistor restore amplifier driver RPD dispersed in the sense amplifier block SAB. Array voltage VDL is generated from an external power source voltage VCC by an internal voltage drop circuit using a reference level VREF0 as shown in FIG. 11 as reference voltage, while high voltage VDH may be directly connected to the external power source voltage VCC via an arbitrary resistance. Also, as shown in FIG. 12, VDH may be generated from the external power source voltage VCC by an internal voltage drop circuit using an internal reference level VREF1 similarly to the array voltage VDL. As shown in FIG. 15, this power source VDH is arranged in mesh-like wiring using a metal third layer M3, i.e. an upper wiring layer, and a metal second layer M2 running perpendicularly to the third layer on the memory array. The metal second layer M2 is connected with the metal third layer via a through-hole TH2. This contributes to the reduction of resistance between power source pad or power source circuit and the sense amplifier. Further, the restore amplifier common source CSP2 is connected with the sense amplifier common source line CSP via a common source separation switch CSTG controlled by a control signal φ TG in the cross area XA. IO gate circuit IOG is a switch to connect the sense amplifier with IO line, and it is controlled by column selection lines YS0, YS1 ... YSn and inputs and outputs the data between the sense amplifier and IO lines. The data line precharge circuit PC is a circuit in which the memory array sets the data line pair at the time of standby to the desired voltage level (in this case, to the data line precharge voltage VDLR, which is ½ of the data line amplitude voltage) according to a control signal φ PC. Circuit PC comprises a switch for short-circuiting between data line pairs and a switch for connecting the data lines to the voltage VDLR. Here, the sense amplifier driver SPD may comprise NMOS transistor. In this case, the logic of the activation signal φ p is reversed. Similarly, the restore amplifier driver RPD may comprise NMOS transistor. In this case also, it is necessary to reverse the logic of the activation signal φ RP.

Figure 3:
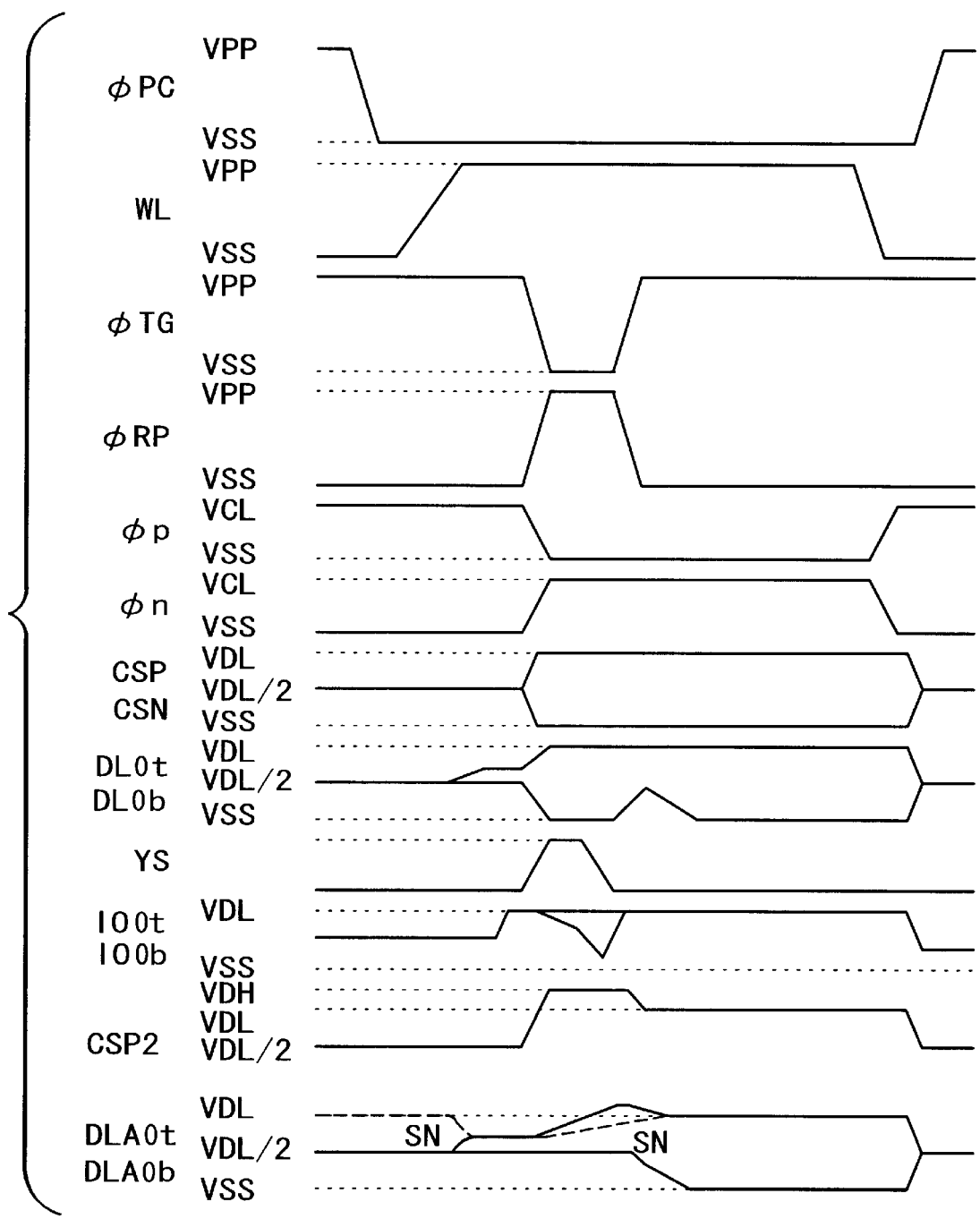
FIG. 3 shows examples of operation waveforms of the first preferred embodiment of the present invention.

The operation of the system of the first preferred embodiment is described below with reference to the waveforms shown in FIG. 3. Based on an active command inputted from outside, the precharge signal φ PC falls to voltage level VSS from the word line voltage rise level VPP or the peripheral circuit power source voltage level VCL, and this terminates equalization and precharge of the data line pairs. Then, a specific word line WL selected from the inputted address is transferred from the standby level voltage VSS to the voltage rise level VPP. Based on this, a micro signal appears between the data line pairs DLAt and DLAb from the memory cell, and the data line DLAt is turned to a voltage, which is higher than VDL/2 by an amount of the signal. In this diagram, a case where 'H' data is read out is shown. Also, in the case of 'L' data, the operation is the same except that the data line DLAt is turned to a voltage lower than VDL/2 by an amount of the signal. The micro signal appearing at the data line pair on array side is transferred to the data lines DLt and DLb in the sense amplifier via NMOS transistors NT0 and NT1 in the restore amplifier. Then, the data line separation signal φ TG is transferred from the word line voltage rise level VPP or the peripheral circuit voltage VCL to the voltage level VSS or to the array voltage VDL. As a result, the data lines on the sense amplifier side and the data lines on the array side are separated from each other or connected via a high resistance. Almost at the same time, or before or after this operation, the sense amplifier cross couple CC is activated by the sense amplifier activation signals φ n and φ p. At the same time, the restore amplifier RAP is activated by the restore amplifier activation signal φ RP. In this case, because the data lines DLt and DLb in the sense amplifier are in small capacity, it is amplified to the array voltage VDL at high speed even when it is at low voltage. On the other hand, either the data line DLAt or the data line DLAb on the array side is amplified to the level of the restore amplifier common source line CSP2 by PMOS transistors P0 and P1 in the restore amplifier RAP where the levels of the data line pairs DLt and DLb in the sense amplifier are inputted. The restore amplifier common source line CSP2 is activated by the voltage VDH, which is higher than the array voltage VDL. In this case, the data line on the array side to be charged or discharged is in large capacity, and voltage drop occurs due to heavy current from the restore amplifier. However, even when voltage drop occurs, the restore amplifier common source line CSP2 is driven by the voltage, VDH, higher than the level of the array voltage VDL, and there is sufficient flexibility of operation up to the level of the array voltage VDL. For this reason, the array side data line on the 'H' side can be amplified at high speed. As a result, on a storage node SN, serving as a storage node of the memory cell, the data can be written as 'H' data. Then, when the array side data line is amplified to the level of the array voltage VDL, the data line on the array side is connected with the data line on the sense amplifier side via NMOS transistors NT0 and NT1 in the restore amplifier RAP by the data line separation signal φ TG. Thus, the 'L' side data line on the array side is transferred to VSS level. In this case, meshed power source on the array is utilized for the power source VSS, and the resistance between the sense amplifier and the low potential level VSS is decreased by the sense amplifier drivers SNDs, which are dispersed in large number in the sense amplifier block, and high-speed restore operation can be achieved on the low potential side. Further, at the same time, the restore amplifier RAP is de-activated by the restore amplifier activation signal φ RP, and the restore amplifier common source line CSP2 is connected with the sense amplifier common source line CSP. When the data lines DLt and DLb are amplified enough in the sense amplifier, the column selection lines YS1, ... YSn selected by column address are activated, and the data of the sense amplifier is outputted to IO lines IO0$t$, IO0$b$, IO1$t$, and IO1$b$. Either of the selection timing by column selection line or the recoupling timing of the sense amplifier and array side data lines is selected, whichever is earlier.

Next, a description is given of the preferred operation during reset. First, based on a precharge command from outside, the selected word line WL is set to the non-selection voltage level VSS. Then, the sense amplifier activation signal φ n is transferred to the voltage level VSS. Almost at the same time, the sense amplifier activation signal φ p is transferred to the voltage level VCL or to the upper level. As a result, the sense amplifier drivers SPD and SND, which have been activating the sense amplifier cross couple, are de-activated. Then, the data line precharge signal φ PC is transferred from the voltage level VSS to the voltage level VCL or to the word line voltage rise level VPP. Precharge of the data line is started, and when the data line pair reaches the precharge level VDLR (VDL/2), the precharge operation is completed.

Figure 19:
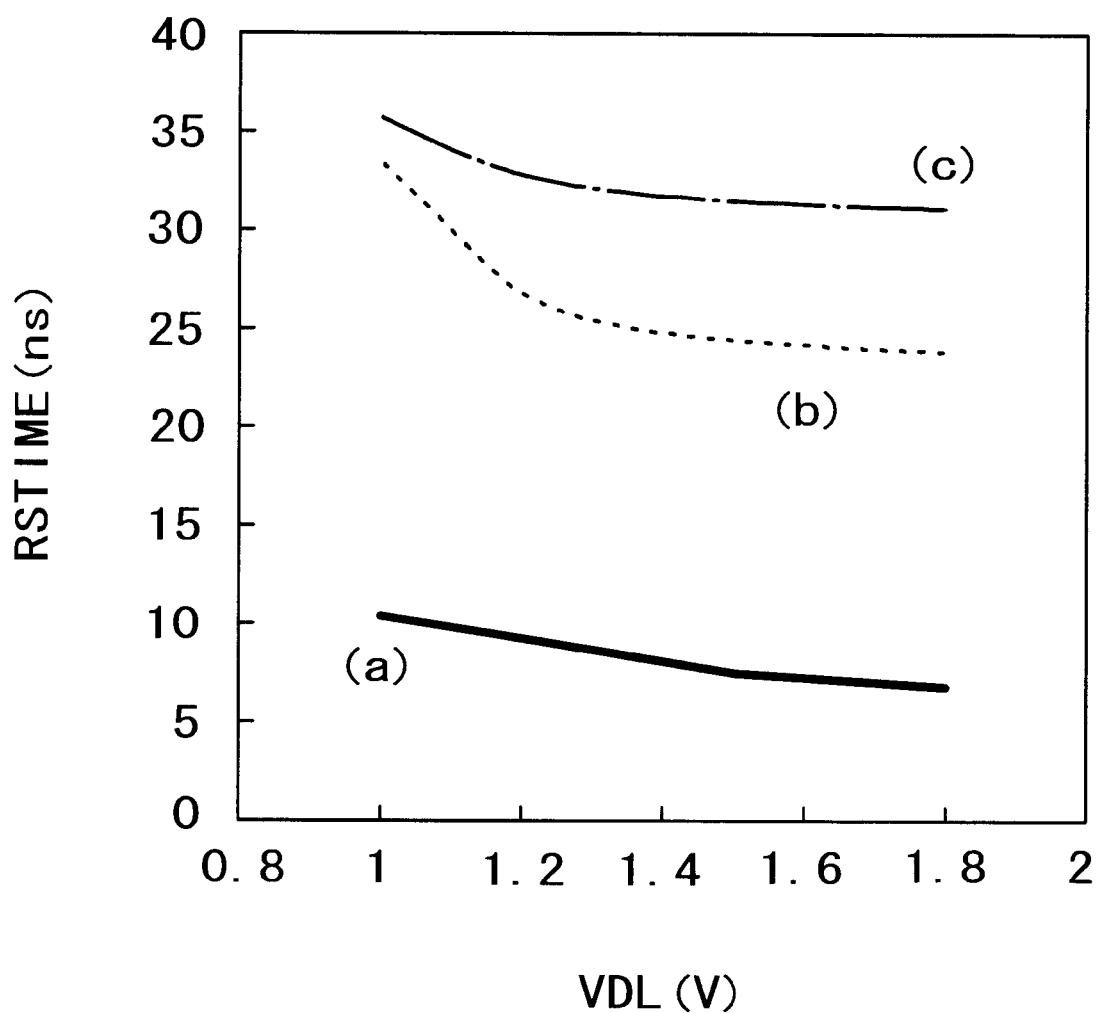
FIG. 19 is a diagram showing array voltage dependency of the restore time.

The advantages of the first preferred embodiment of the present invention are described in detail below. (1) The sense amplifier and the restore amplifier are activated at the same time, and the restore time is shortened. Because the array voltage VDL serving as the power source of the sense amplifier is a power source different from the high voltage power source VDH, of the restore amplifier, the changes in the power source on the sense amplifier side are decreased even when the array side data line of large capacity is being charged by the restore amplifier. This makes it possible to provide high-speed sense operation and stable data output. FIG. 19 represents the results of a simulation, showing the relation between the time for writing up to 90% of the storage node of the memory cell (restore time) RSTIME (ns) and the array voltage VDL (V). In this preferred arrangement, the restore time is turned to (a) and it is possible to achieve high-speed operation compared with the conventional methods (b) and (c).

(2) To the power source to activate the restore amplifier, wiring resistance is reduced by the meshed power source on the array and by the restore amplifier drivers dispersed in a large number in the sense amplifier. Also, a power source VDH higher than the data line amplitude voltage is utilized, and 'H' data can be written to the storage node of the memory cell at high speed without being influenced by voltage drop on the wiring resistance caused by charge/discharge current.

(3) Meshed power source wiring on array is used as the wiring of low potential level VSS and a large number of NMOS transistor sense amplifier drivers are dispersed in the sense amplifier block. As a result, the resistance between the sense amplifier and the low potential level VSS is decreased, and this contributes to the improvement of writing speed on the low potential side.

Figure 13:
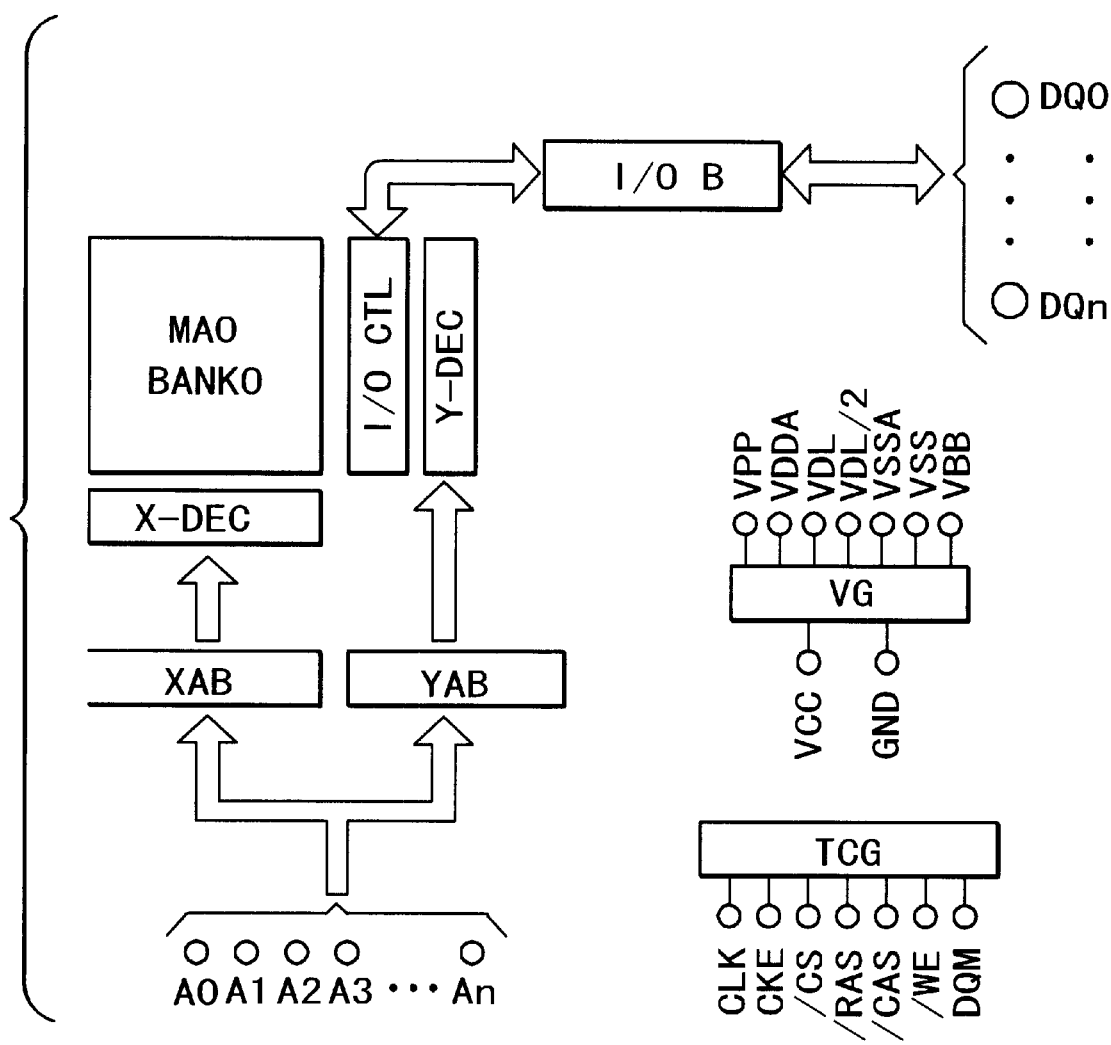
FIG. 13 is a block diagram of SDRAM of the present invention.

Next, application of the present invention to a synchronous DRAM (SDRAM), is described below. FIG. 13 shows the entire block of SDRAM. Each circuit block is operated at the timing of an internal control signal, which is formed on a timing signal generating circuit TCG where a control signal is inputted. As the control signals to be inputted to the timing signal generating circuit TCG, there are a chip selection signal CS inputted at the timing of clock signal CLK, a row address strobe signal RAS, a column address strobe signal CAS, and a write enable signal WE. The commands are generated by a combination of these control signals with address signals. A clock enable signal CKE determines whether the clock signal is valid or not. Also, input/output mask signal DQM is a signal to control data input/output buffer I/OB for masking the data inputted or outputted from I/O terminals (DQ0 ... DQn). The power source generating circuit VG supplies word line voltage rise level (VPP), substrate potential (VBB), array voltage (VDL), peripheral circuit voltage (VCL), etc. to the circuits. In SDRAM, the address multiple method is adopted, by which row address or column address is inputted from address input terminals (A0, A1 ... An) on a time division basis. A row address inputted to a row address buffer XAB from the address input terminal is decoded at a row address decoder X-DEC, and a specific word line in one memory array (MA) is selected. To match this, a memory cell for 1 word is turned to selection status. Then, when a column address is inputted to column address buffer YAB, a memory cell to read out or write is selected by a column address decoder Y-DEC. SDRAM usually has a plurality of memory arrays (or memory banks) designated by bank address. In FIG. 13, only one memory array MA (BANK0) is shown per convention.

Figure 14:
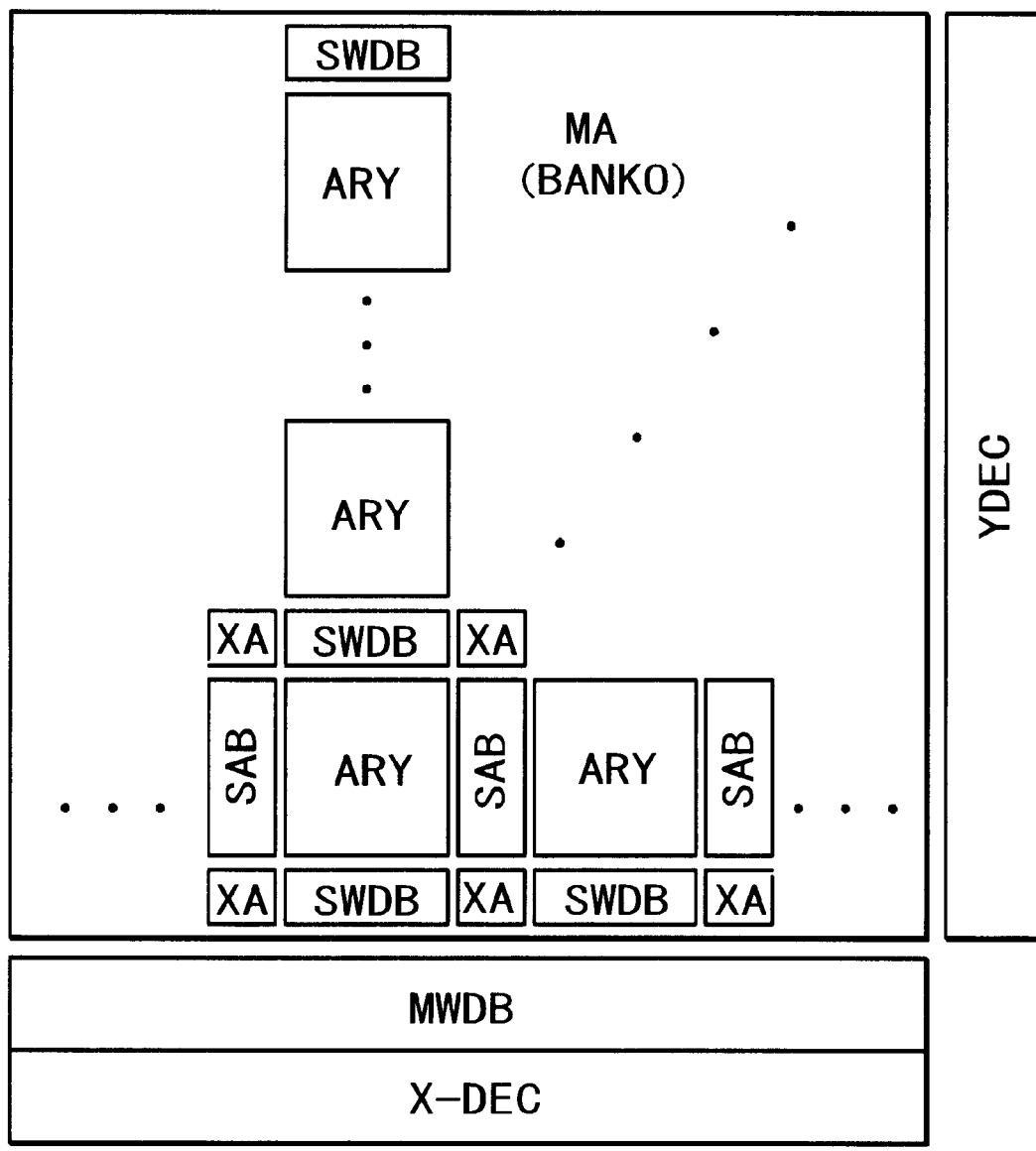
FIG. 14 is a diagram of a bank inside a DRAM.

As shown in FIG. 14, in one of the banks of DRAM, to which the present invention is applied, there are a plurality of memory areas enclosed by X-DEC to select the word lines from row address and by Y-DEC to select the data lines from column address, and a plurality of sub-memory arrays (ARY) arranged in the form of a matrix are included in the memory areas. Although there is no specific restriction, this memory array adopts a hierarchical word line system, and a main word driver block MWDB is arranged on one side of the MA. The main word line to be connected to the main word driver block MWDB is positioned on an upper metal wiring layer as if it strides over a plurality of sub-memory arrays ARY. Also, for the selection of column direction, a common Y decoder system is adopted, in which a plurality of column selection lines (YS lines) outputted from the column decoder Y-DEC stride over a plurality of sub-memory arrays ARY. Here, the sub-memory array ARY means a minimum memory array block enclosed by the sub-word driver block SWDB comprising a plurality of sub-word driver blocks SWDB and a sense amplifier block (SAB) comprising a plurality of sense amplifier circuits. When the present invention is applied to the sense amplifier blocks as described above, access time up to the read-out of the data of the memory array to outside from command input can be shortened, and the time of rise-up of one word line can be reduced. This is advantageous in shortening the row cycle time.

FIG. 4 shows a preferred variation of the first preferred embodiment wherein NMOS transistor sense driver SND2 for driving NMOS transistor common source line CSN to the data line low potential VSS is positioned in the cross-area XA. Other circuit configuration and operation time are the same as in the first preferred embodiment described above. The sense amplifier driver SPD may comprise NMOS transistor. In such case, the logic of the activation signal φ p is reversed. Similarly, the restore amplifier driver RPD may comprise an NMOS transistor. In this case also, the logic of the activation signal φ RP must be reversed. The features of this arrangement are such that, in addition to the features of the first preferred embodiment, the number of transistors in the sense amplifier block is fewer, and this contributes to the reduction of layout area of the sense amplifier block.

Figure 5:
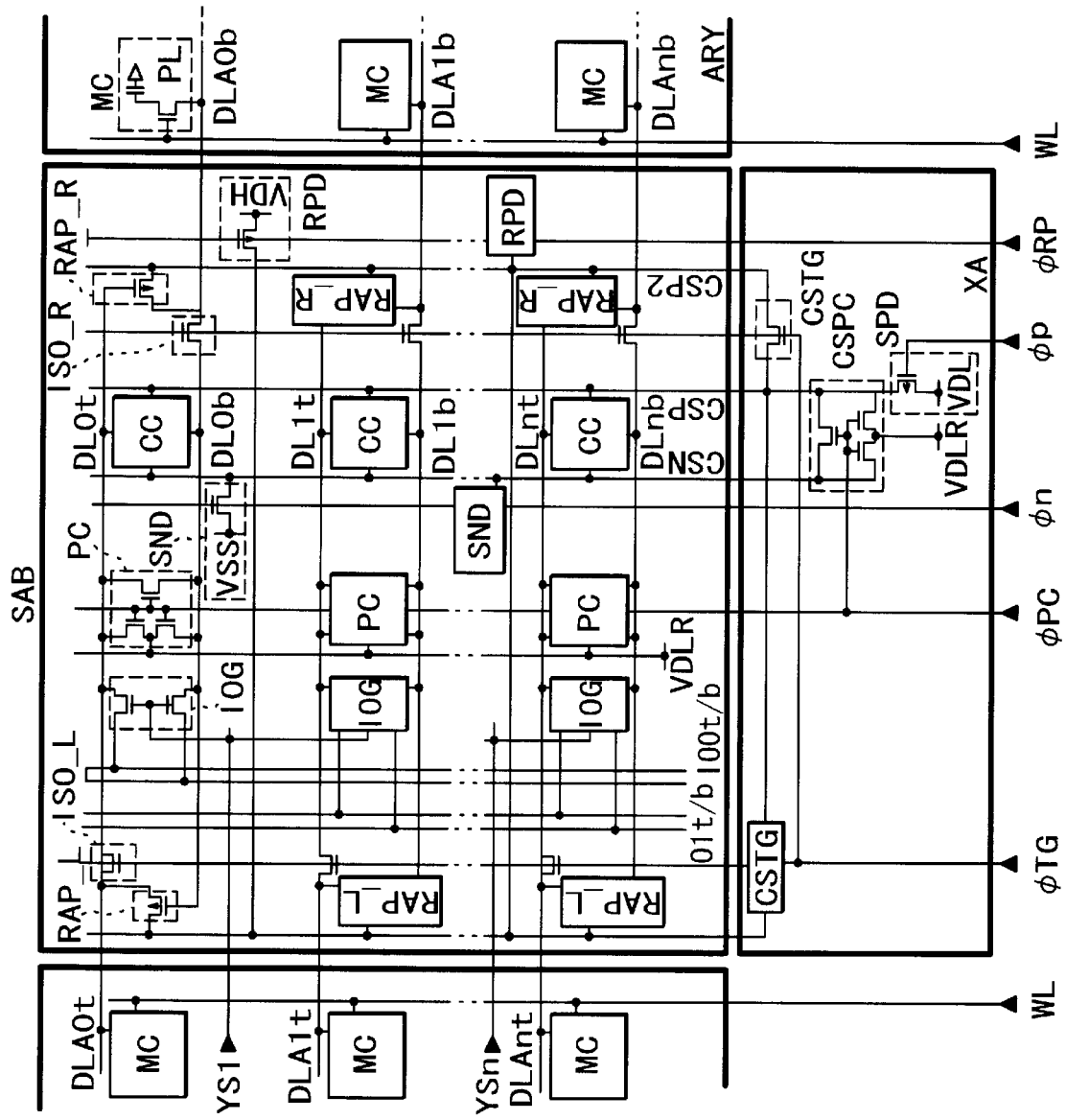
FIG. 5 is a block diagram of the sense amplifier block and its peripheral circuits in the case where the first preferred embodiment of the present invention is applied in the arrangement of an open type data line.

Next, an arrangement of the sense amplifier is described wherein the first preferred embodiment of the present invention is applied to an open type array. FIG. 5 is a circuit diagram of the sense amplifier block SAB of an open type array where the sense amplifiers are positioned in zigzag arrangement. In the open type data line array configuration, one each of the memory arrays ARY at left and right is connected to one sense amplifier circuit. In the following, a description is given of the data line pairs with subscript 0. In the sense amplifier block SAB, the data line DLA0*t* taken out from the left side is connected to a left restore amplifier RAP_L. Then, it is coupled with or separated from the data line DL0*t* in the sense amplifier by NMOS transistor transfer gate at the data line separation transistor ISO_L controlled by the data line separation control signal φ TG. Similarly, the data line DLA0*b* taken out from the right memory array ARY is connected to a restore amplifier at right RAP_R. Then, it is controlled to couple with or to be separated from the data line DL0*b* in the sense amplifier by NMOS transistor at the data line separation transistor ISO_R controlled by the data line separation control signal φ TG. To the data lines DL0*t* and DL0*b* in the sense amplifier, precharge circuit PC, cross couple circuit CC, and IO gate circuit IOG are connected. These circuits are the same as those in the first preferred embodiment. The source line CSP2 of the restore amplifier is driven to the voltage VDH with higher potential than the array voltage VDL by the restore amplifier drivers RPDs arranged in a plurality in the sense amplifier block by the control line φ RP.

Figure 7:
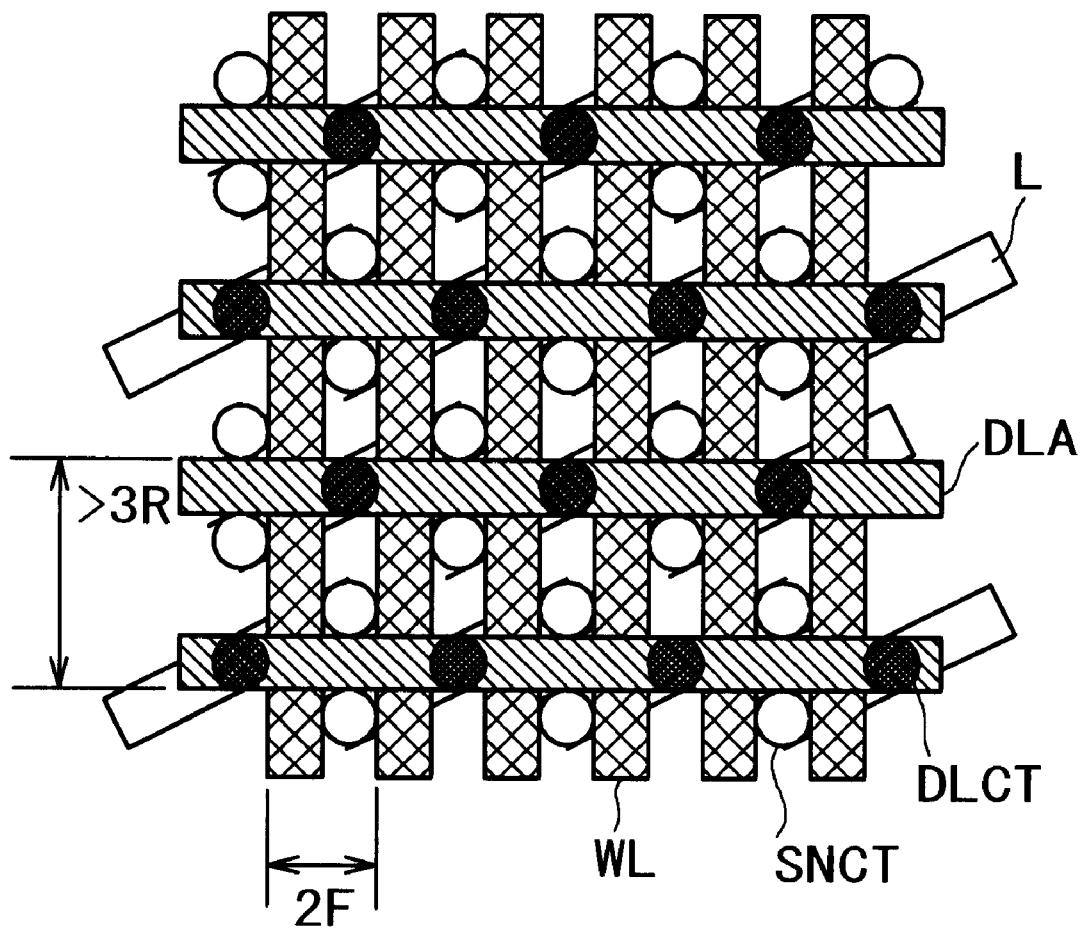
FIG. 7 shows a layout of a memory array in the arrangement of an open type data line.

FIGS. 6A and 6B show examples of layouts of the cross couple CC, left and right restore amplifiers RAP_L and RAP_R, and data line separation transistors ISO_L and ISO_R between the array and the sense amplifier in the circuit diagram. FIG. 6A shows a P-type diffusion layer P-DIFF, an N-type diffusion layer N-DIFF, a gate layer GT and a contact CNT to the gate layer. FIG. 6B shows a metal first layer M1 and contacts to the gate layer and the diffusion layer. Although it is not shown in the layout of FIG. 6A, source terminals of the restore amplifiers RAP_L and RAP_R at left and right are connected to the upper wiring layer. In the layout diagram of FIG. 6A, a layout of memory cell array as shown in FIG. 7 is assumed. In this memory cell layout, the diffusion layer crosses diagonally with respect to the data line DLA, and memory cells are arranged at intersections of all word lines WL and the data lines DLA, . . . Data line DLA diffusion layer contact DLCT and storage node diffusion layer contact SNCT are arranged linearly on the diffusion layer. In this layout, the area of one memory cell is about $6F^2$. This is about ¾ compared with the memory area $8F^2$ of the folded type memory array, and chip area can be reduced. Here, F is a minimum fabrication dimension, and it is ½ of word line or data line, whichever has smaller pitch. In this case, if it is assumed that pitch of the word line WL is 2F, wiring pitch of the data line DLA is 3F or more in order to have the pitch of the diffusion layer being 2F or more. As a result, in case this memory cell layout is used, pitch of the sense amplifier layout in the sense amplifier block SAB can be made to 6F or more. Restore amplifiers RAP_R and RAP_L and the data line separation transistors ISO_L and ISO_R are arranged on both sides of the block, and this facilitates wiring layout of the metal first layer M1, which serves as the data line wiring layer.

The advantages of this arrangement are such that, in addition to the features of the first preferred embodiment, an open type memory array with small memory cell area of data line pitch alleviation type is used. As a result, the restore amplifier is divided to the left and right of the sense amplifier block. This makes it easier to have a wiring layout near the restore amplifier and the data line separation transistor and it is helpful in achieving smaller chip area. As a result, it is possible to achieve small area, high speed access, and shorter cycle time.

Figure 8:
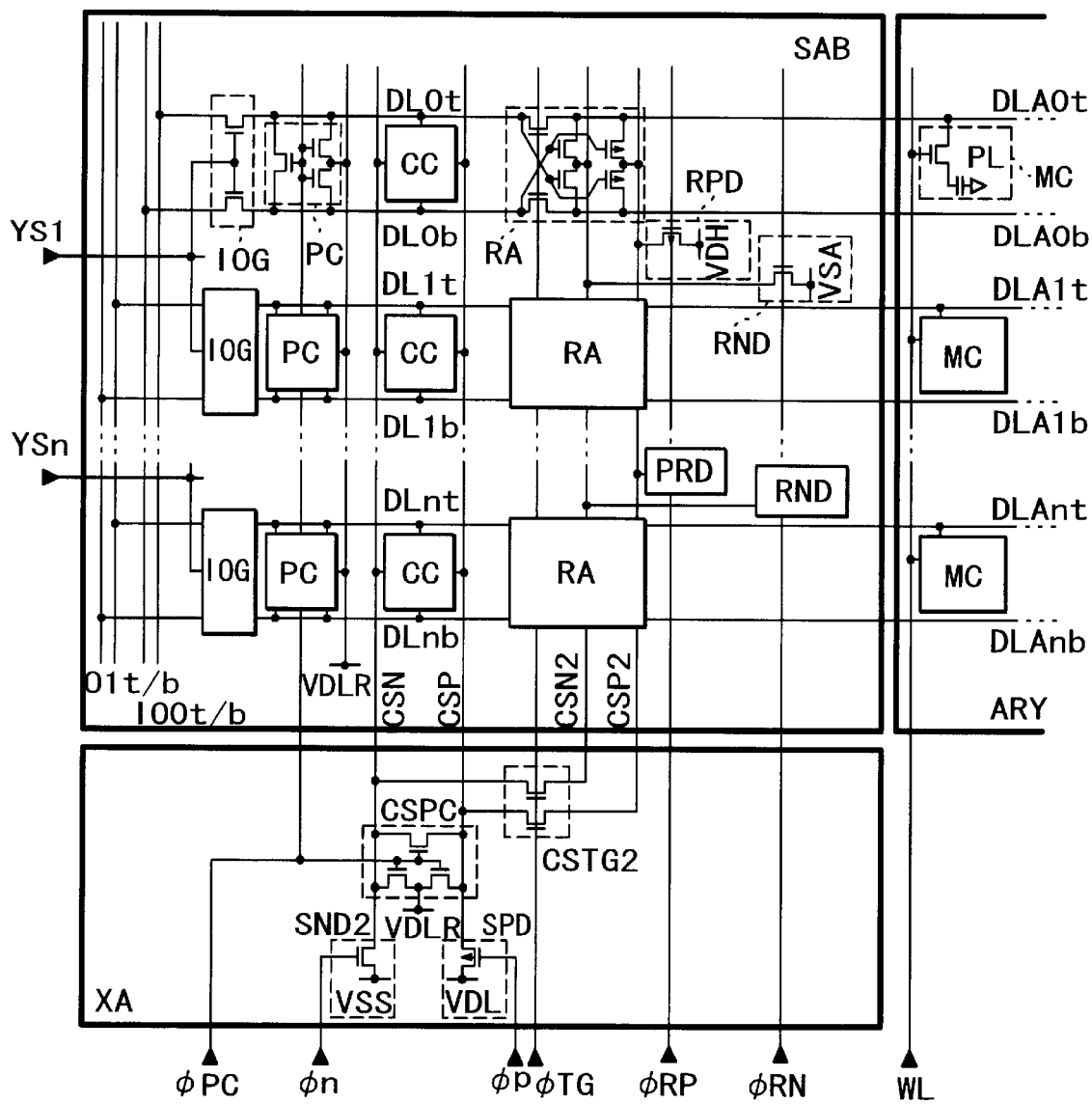
FIG. 8 is a block diagram of a sense amplifier block and its peripheral circuits of a second preferred embodiment of the present invention.
Figure 9:
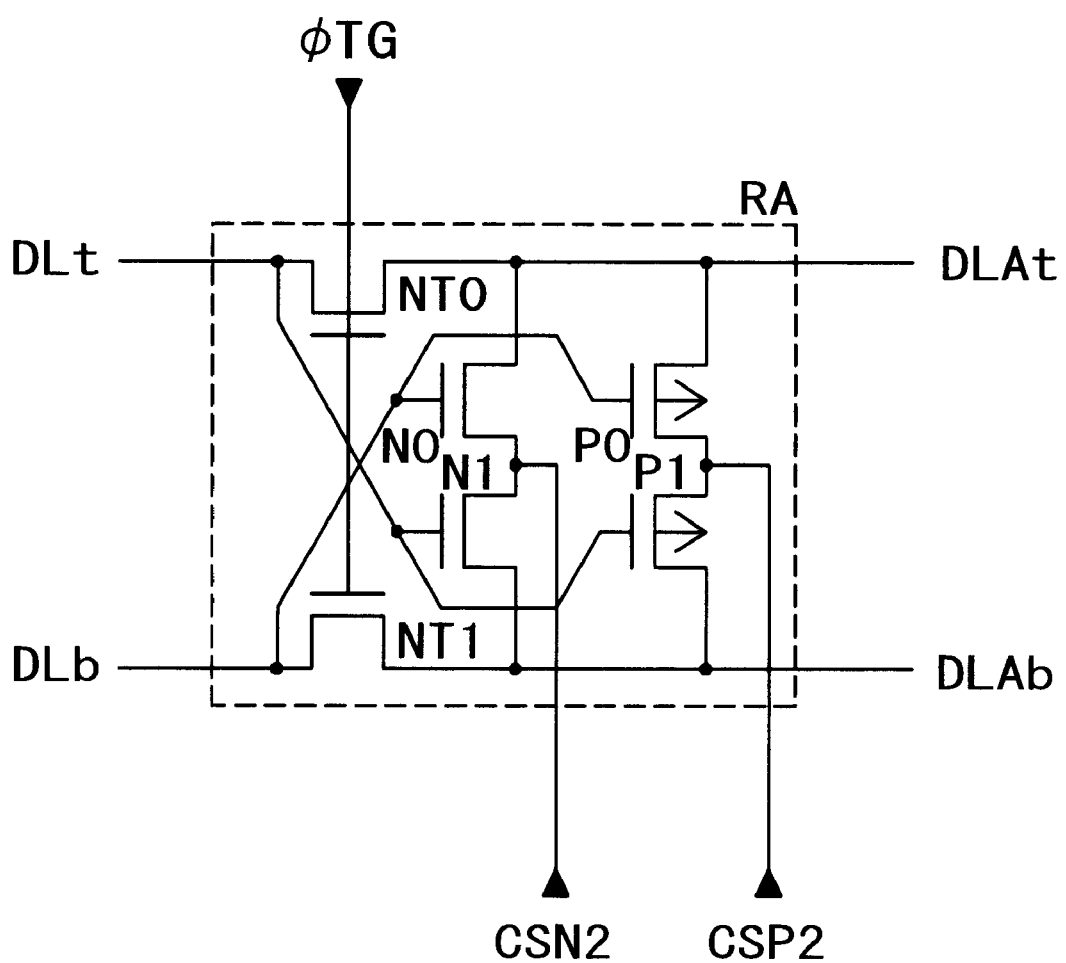
FIG. 9 is a diagram showing a restore amplifier of the second preferred embodiment of the present invention.

Next, a second preferred embodiment of the present invention is described with reference to FIG. 8. In this arrangement, the TG restore amplifier RA comprising PMOS transistor in the first preferred embodiment has been changed to a TG restore amplifier comprising CMOS. PMOS transistor common source CSP2 of TG restore amplifier RA is driven to the voltage VDH higher than the array voltage VDL by PMOS transistor restore amplifier drivers RPDs arranged in a large number in the sense amplifier block SAB. Similarly, NMOS transistor common source CSN2 of the restore amplifier is driven to voltage VSA, which has a potential equal to or lower than the data line low potential VSS and has different wiring on the memory array MA, by NMOS transistor restore amplifier drivers RNDs arranged in a large number in the sense amplifier block SAB. Similarly to the wiring of power source VDH shown in FIG. 15, mesh-like wiring is used for the power sources VSA and VDH using upper level wiring layers M2 and M3 on the array, and wiring resistance is reduced. PMOS transistor common source line CSP2 of TG restore amplifier RA is coupled with or separated from PMOS transistor common source line CSP of the sense amplifier cross couple CC at the common source separation circuit CSTG controlled by the control signal φ TG arranged in the cross area XA. Similarly, NMOS transistor common source CSN2 of TG restore amplifier RA is coupled with or separated from NMOS transistor common source line CSN of the sense amplifier cross couple CC at the common source separation circuit CSTG controlled by the control signal φ TG arranged in the cross area XA. Referring to FIG. 9, the TG restore amplifier is described below. TG restore amplifier RA comprises data line separation NMOS transistors NT0 and NT1, PMOS transistors P0 and P1, and NMOS transistors N0 and N1 of the restore amplifier. In the data line separation NMOS transistors NT0 and NT1, a data line separation control signal φ TG is inputted. These transistors couple or separate the data lines DLt and DLb in the sense amplifier and data lines DLAt and DLAb on the array side. The sources of PMOS transistors P0 and P1 are commonly connected to the common source line CSP2. Similarly, each of the sources of NMOS transistors N0 and N1 are commonly connected to the common source line CSN2.

Figure 10:
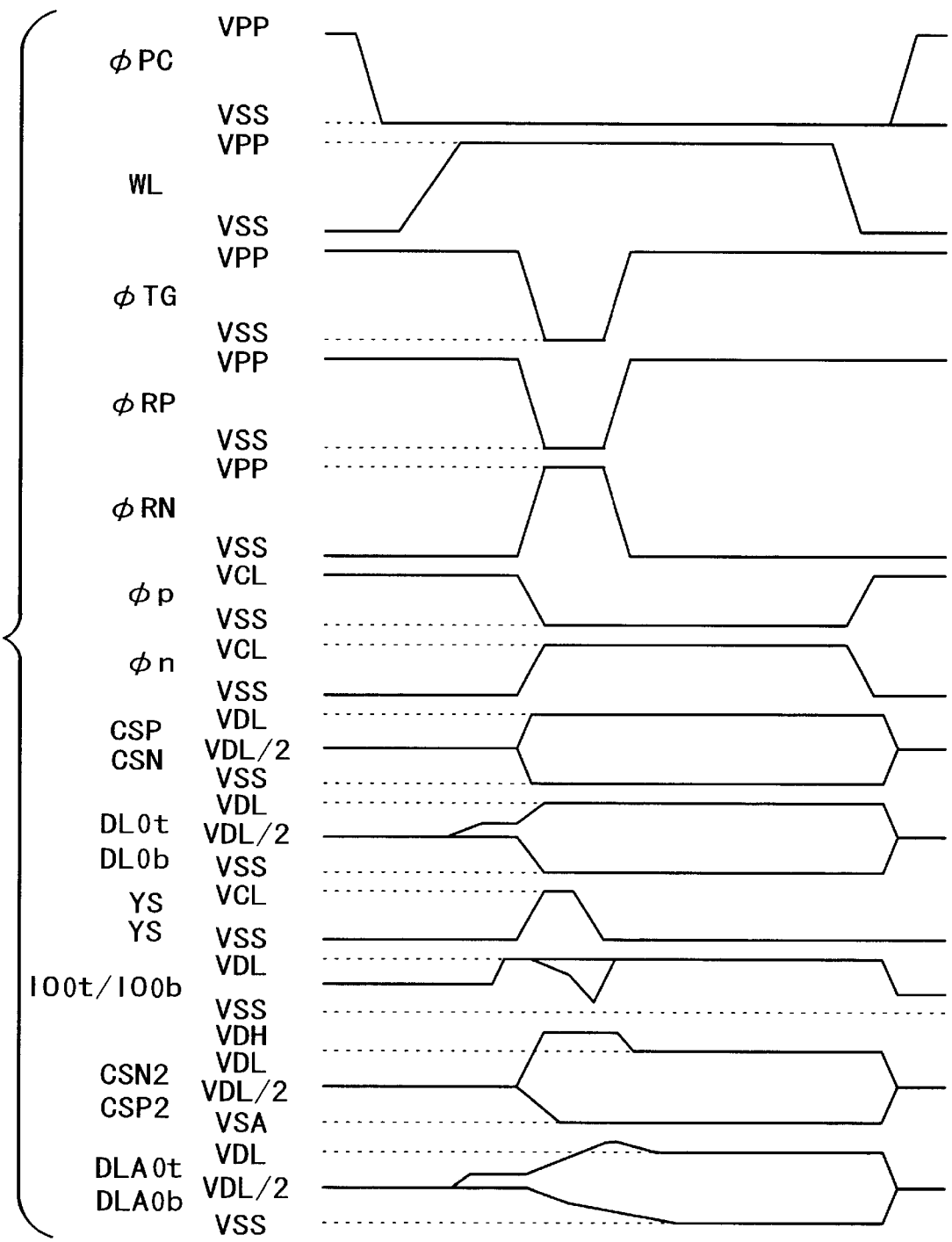
FIG. 10 shows examples of operation waveforms of the second preferred embodiment of the present invention.

Next, a description of a preferred operation of this arrangement is given with reference to FIG. 10. The operation after command input, selection of WL, and read-out of the data of the memory cells on the data line is the same as in the first preferred embodiment. The data of the memory cell are read in the data lines DL0*t* and DL0*b* of the sense amplifier, and word line voltage rise level VPP is transferred to the array voltage VDL or the data line low potential VSS by the data line separation signal φ TG. Then, the array side data line is separated from the sense amplifier side data line by data line separation switches NT0 and NT1 in TG restore amplifier RA. Almost at the same time, according to the sense amplifier activation signals φ n and φ p, sense amplifier common source lines CSN and CSP are driven to data line low level VSS and array voltage VDL by the sense drivers SND2 and SPD arranged in the cross area XA. As a result, the cross couple circuit CC is activated. At the same time, the common source lines CSN2 and CSP2 of TG restore amplifier are driven to the voltage level VSA with potential equal to or lower than array side data line low level and to the voltage VDH higher than the data line amplitude voltage by the restore amplifier drivers RND and RPD dispersed in a large number in the sense amplifier block SAB by the restore amplifier activation signals φ RN and φ RP. As a result, the 'H' side data line on the array side is amplified toward high potential VDH and the 'L' side data line is amplified toward VSA. When the high potential side data line reaches the data line amplitude voltage VDL, data line separation on array side and sense amplifier side by the data separation signal φ TG is terminated and recoupling occurs. At the same time, the sense amplifier common source line CSN is connected to the common source line CSN2 of the restore amplifier by a common source separation switch CSTG2 arranged in the cross area XA, and it is driven to the data line low voltage level VSS. Similarly, the common source line CSP and the restore amplifier common source line CSP2 are connected by the common source separation switch CSTG2 arranged in the cross area XA and are driven to the data line amplitude voltage VDL. The restore amplifier is de activated by the restore amplifier activation signals φ RP and φ RN. When the data lines DLt and DLb in the sense amplifier have been sufficiently amplified, column selection lines YS1 . . . YSn selected by the column address are activated and the data of the sense amplifier are outputted to IO lines IO0t, IO0b, IO1t, and IO1b. Selection timing based on column selection line or recoupling timing of data lines in the sense amplifier and the array side data line is selected, whichever is earlier.

Next, a description of a preferred operation at the time of reset is given below. When a precharge command is inputted, the selected word line WL is transferred to the voltage VSS, which is on the de-activated level. Then, the cross couple CC is de-activated by the sense amplifier activation signals φ n and φ p. Based on this, the data line precharge signal φ PC rises up to the word line voltage rise level VPP, and the amplified data line pair is set to the precharge level VDLR. At the same time, the cross couple common source lines CSN and CSP and the restore amplifier common source lines CSP2 and CSN2 are set to the data line precharge level VDLR.

The advantages of the present second preferred embodiment of the invention are described below. (1) In addition to the features of the first preferred embodiment, the power sources on low potential side of the sense amplifier and the restore amplifier are separated, and this makes it possible to perform sense operation at higher speed and to achieve stable data output. (2) In the activated power sources VDH and VSA of the restore amplifier and the meshed power source on the array, wiring resistance is reduced by the restore amplifier drivers dispersed in a large number in the sense amplifier, and the power source VDH higher than the data line amplitude voltage is utilized. As a result, it is possible to write the 'H' data to the storage node of the memory cell at high speed without being influenced by voltage drop at the wiring resistance generated by charge/discharge current. (3) Compared with the first preferred embodiment, amplification is also performed to the low potential side by the restore amplifier. Thus, the time to amplify the low potential side is shortened after recoupling of the data line, and this leads to shorter restore time on the low potential side. As a result, high-speed access and shorter cycle times are achieved.

A third preferred example of the present invention is described below with reference to FIG. 16. This preferred embodiment differs from the first and second preferred embodiments in which the sense amplifier and the data line on the memory array side are separated from each other and separately amplified. Instead, in the third preferred embodiment, by micro signal read out from the memory cell, data are outputted to the external data output line and high-speed access can be achieved, and high-speed restore operation can be carried out by overdrive method. FIG. 16 shows a preferred sense amplifier block SAB of the present invention. In this figure, a folded type data line configuration array is shown, while this preferred embodiment of the present invention may also be applied to an open type array. Further, the invention can also be applied to a shared sense amplifier configuration to commonly share the sense amplifier block SAB at the left and right memory arrays ARY.

Figure 17:
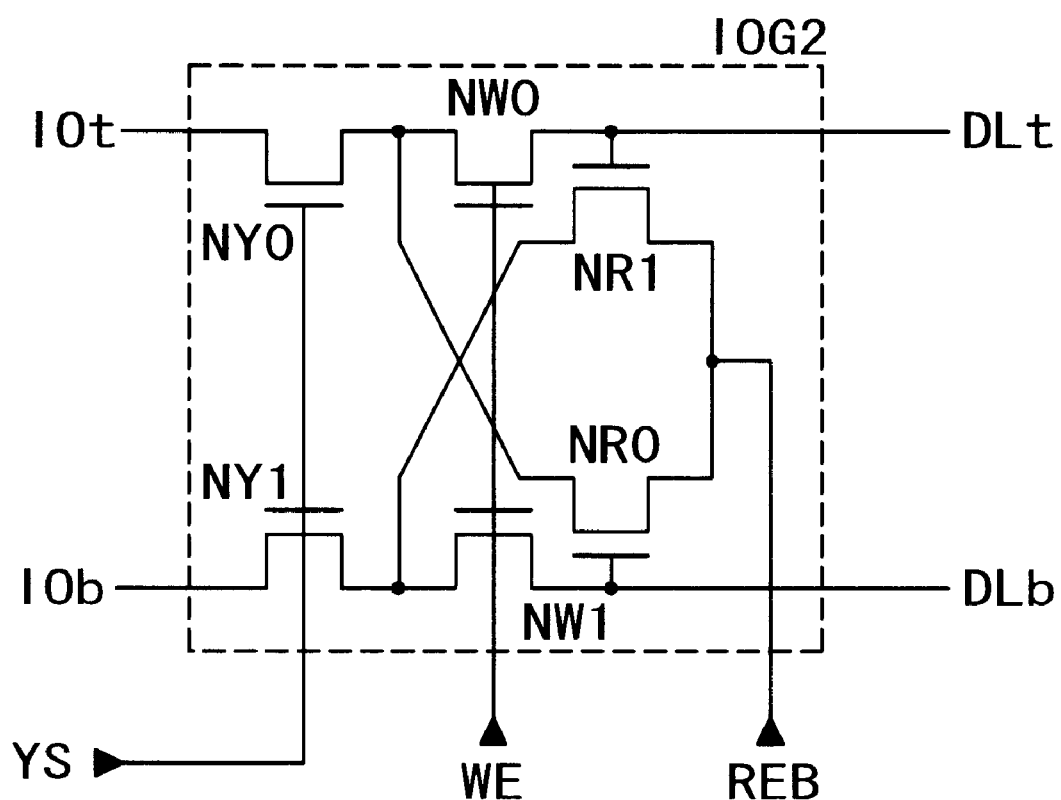
FIG. 17 is a diagram showing an IO gate of the third preferred embodiment of the present invention.

In this arrangement, a direct sense type IO gate IOG2, a precharge circuit PC, and a cross couple circuit CC are connected to the data line pairs DL0t and DL0b and DL1t and DL1b . . . DLnt and DLnb in the sense amplifier, respectively. Common source line CSN of the cross couple CC is controlled by the control signal φ n, and it is driven to the low potential level VSS by the sense amplifier drivers SNDs dispersed in large number in the sense amplifier block SAB. PMOS transistor common source line CSP of the cross couple CC is controlled by a control signal φ p1 and is driven to high voltage VDH by the sense amplifier drivers SPD1 dispersed in large number in the sense amplifier block SAB. Then, PMOS transistor common source line CSP is driven to the array voltage VDL by SPD2 arranged in the cross area XA according to a control signal φ p2. The precharge circuit PC is the same as in the previously described preferred embodiments. Features of the direct sense type IO gate IOG2 are such that the data can be outputted to IO lines IOt and IOb when the data is read out to the sense amplifier from the memory cell. As a result, the data can be outputted before the data lines are amplified, and this means that high-speed access time can be achieved. FIG. 17 shows a direct sense type IO gate circuit IOG2. In the direct sense type IO gate, data lines DLt and DLb are inputted to the gate by NMOS transistors NR1 and NR0, and these are operated as differential amplifiers. At the IO gate IOG2 selected by the column selection line YS, this differential amplifier is connected with IO line, and potential difference is developed at IO lines IOt and IOb. NMOS transistors NW0 and NW1 are switches to connect IO lines with data lines.

Figure 18:
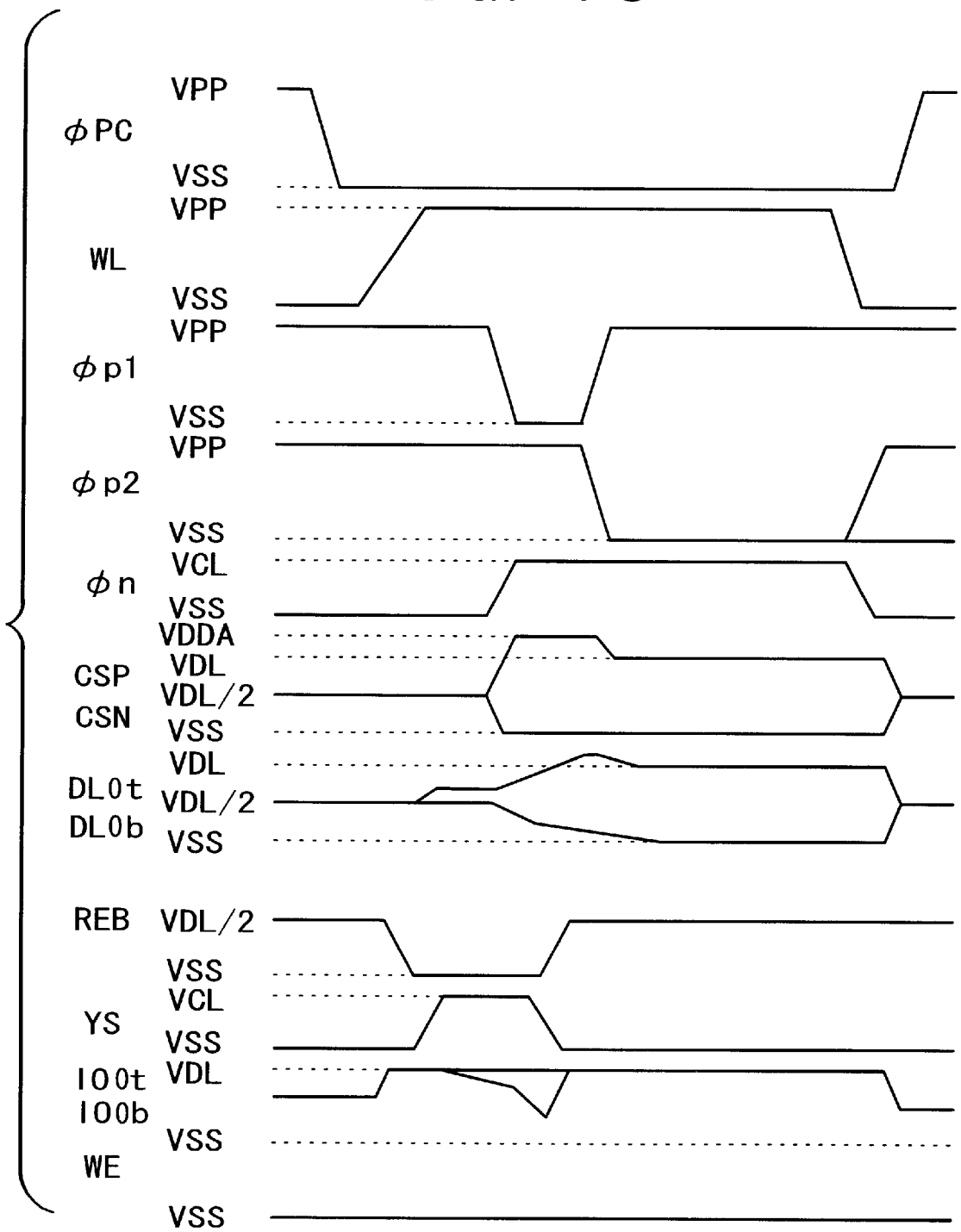
FIG. 18 shows examples of operation waveforms of the third preferred embodiment of the present invention.

Now, a description of a preferred operation of this third preferred embodiment is given below referring to FIG. 18. The procedure up to the selection of the word line from the bank active command is the same as in the previously described preferred embodiments. In the read-out operation in this third preferred embodiment, data is read out from the memory cell to the sense amplifier, and it is transferred from the data line precharge level VDLR to the data line low potential level VSS by IO gate read-out activation signal REB. Almost at the same time, either one of the column selection lines YS1, YS2 . . . YSn is transferred from non-selection level VSS to peripheral circuit voltage level VCL or array voltage level VDL or word line voltage rise level VPP. As a result, the direct sense type IO gate IOG2 is activated, and the data of the sense amplifier is outputted to IO line pairs IO0t, IO0b, and IO1t and IO1b. Thus, even when the column selection line is activated earlier than the sense amplifier activation signal, the data in the sense amplifier is not destroyed. The column selection line can be activated at an earlier time, and output of the data of the memory cell to outside can be carried out at high speed. When all read-out operations are completed, the IO gate read-out activation signal REB is transferred to the data line precharge level. On the other hand, at the sense amplifier, when the data of the memory cells has been read out sufficiently, the common source line CSN is driven to the low potential level VSS and the common source line CSP is driven to high voltage VDH by the sense amplifier activation signal φ n and the sense amplifier PMOS transistor activation signal φ p1. In this case, the sense amplifier drivers SND and SPD1 are dispersed in large number in the sense amplifier block. Wiring of the power sources VSS and VDH used in the sense amplifier comprises meshed power source on the array, and resistance is reduced. Thus, high voltage is sufficiently applied on the sense amplifier. As a result, the sense amplifier is driven at high voltage VDH. This makes it possible to perform charging and discharging at relatively high speed on the entire data lines, and to perform the writing operation to the storage nodes of the memory cell at high speed. When the high potential side of the data line is turned to about the level of the array voltage VDL, φ p1 is de-activated, and φ p2 is activated. The common source line CSP is driven at the array voltage VDL by the sense amplifier driver SPD2 arranged in the cross area XA. Then, the high potential side of the data line is set to the array voltage VDL.

Next, a description of a preferred precharge operation of this third preferred embodiment is given below. When a precharge command is inputted, the selected word line WL is turned to the non-selection voltage level. Next, the sense amplifier activation signals φ n and φ p2, which have been activating the sense amplifier cross couple CC, de-activate the sense amplifier cross couple CC. Then, the data line precharge signal φ PC rises up from the de-activated level to the word line voltage rise level VPP, and the precharge of the data line is performed.

Next, the advantages of this third preferred embodiment of the present invention are described below. In this case, data can be outputted to IO line based on the micro signal read out from the memory cell instead of amplifying the data line in the sense amplifier, and high-speed access operation can be carried out. On the other hand, in the restore operation, through activation by the voltage VDH higher than the array voltage using meshed power wiring on the array and through dispersed arrangement of the sense driver in the sense amplifier, high voltage can be applied to the sense amplifier by excluding influence of wiring resistance. Thus, data lines of large capacity can be charged and discharged at high speed. Writing operation to the storage nodes of the memory cell is performed at high speed, and cycle times are shortened.

While there is no specific restriction on the present invention, it is preferable that it is applied to a DRAM having an array voltage VDL of not more than 1.2 V. In the setting of voltage, it is preferable that the word line voltage rise level VPP is set to 2.8 V, external voltage VCC is set to 1.5 V or 1.8 V, and high voltage VDH used for overdrive is set to 1.5 V or 1.8 V in direct connection with VCC. As the size of the memory cell of the DRAM, to which the present invention is applied, it is preferable to apply to word line pitch of not more than 0.2 μm, for which it is necessary to apply lower voltage.

The invention can be applied not only to the DRAMs as described above but also to a logic-embedded DRAM. In this case, it is advantageous in that random access can be achieved at high speed because row cycle time can be reduced. In the memory cell system, the same effects can be obtained when the invention is applied to FeRAM (Ferroelectric Random Access Memory), for which re-writing operation is needed as in case of DRAMs.

As described above, according to a first preferred aspect of the present invention, a restore amplifier is added to TG clocking sense system to reduce the sense time, and the sense amplifier and the restore amplifier are driven using different power sources. As a result, stable and high-speed operation of the sense amplifier can be carried out, and a high-speed restore operation can be achieved by the use of high voltage on the restore amplifier. According to another preferred aspect of the present invention, a direct sense type IO gate and an overdrive sense system are adopted. As a result, a small voltage difference of the sense amplifier can be amplified and can be read out on the data output line, and access time is shortened. Further, cycle time can be made shorter by high speed restore operation based on the overdrive system. By such arrangement, it is possible to achieve high-speed access operation and shorter cycle time.

According to the present invention, in a semiconductor device including a DRAM memory cell, it is possible to achieve high-speed operation of the sense amplifier and shorter cycle time based on this operation.

The foregoing invention has been described in terms of preferred embodiments. However, those skilled, in the art will recognize that many variations of such embodiments exist. Such variations are intended to be within the scope of the present invention and the appended claims.

The foregoing invention has been described in terms of preferred embodiments. However, those skilled, in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor device, comprising:
   a plurality of memory cells each disposed at one of a plurality of intersections between a plurality of word lines and a plurality of data lines;
   a plurality of first sense amplifiers each comprising a pair of MISFETs of a first conductivity type arranged to match each of said plurality of data lines;
   a first common source line where source nodes of said plurality of first sense amplifiers are commonly connected;
   a first power source supply line for supplying a first power source to said plurality of first sense amplifiers;
   a first switch positioned between said first power source supply line and said first common source line;
   a second switch connected between said first sense amplifier and said data line;
   a plurality of second sense amplifiers each comprising a pair of MISFETs of a first conductivity type for amplifying said data lines on a side where memory cells are connected by said second switch according to data of said data line amplified by said first sense amplifier;

a second common source line where source nodes of said plurality of second sense amplifiers are commonly connected;

a second power source supply line for supplying a second power source to said plurality of second sense amplifiers; and a third switch provided between said second power source supply line and said second common source line.

2. A semiconductor device according to claim 1, wherein said first conductivity type is P-type, and said second power source voltage is higher than said first power source voltage.

3. A semiconductor device according to claim 1, wherein said first conductivity type is N-type, and said second power source voltage is lower than said first power source voltage.

4. A semiconductor device according to claim 1, further comprising;

a fourth switch provided between said first common source line and said second common source line; and said second common source line is connected to said first common source line as the fourth switch is activated after said second common source line is activated at the second power source for a given period of time by said second switch.

5. A semiconductor device according to claim 1, wherein:

said plurality of data lines comprise open type data lines; and each of said first sense amplifiers is disposed between a pair of MISFETs comprising one of said plurality of second sense amplifiers.

6. A semiconductor device according to claim 1 further comprising:

a first region substantially rectangular in shape having an angle between first and second intersecting sides wherein said plurality of word lines, said plurality of data lines, and said plurality of memory cells are disposed in said first region;

a second region provided along said first side and comprising said plurality of first and second sense amplifiers, said first and second power source supply lines, said first and second common source lines, and said plurality of second and third switches;

a third region arranged along said second side and comprising a plurality of connections between one of a plurality of word line driving circuits and one of said plurality of word lines; and a fourth region, sharing said angle of said first region, where said first switch is disposed and wherein said fourth region is enclosed by said second and said third regions.

7. A semiconductor device according to claim 1 further comprising:

a third sense amplifier containing MISFET pairs of a second conductivity type arranged in parallel to said first sense amplifier;

a third common source line where source nodes of said plurality of third sense amplifiers are commonly connected;

a third power source supply line for supplying a third power source to said plurality of third sense amplifiers; and a fourth switch provided between said third power source supply line and said third common source line, whereby:

said third power source voltage is lower than said first power source voltage.

8. A semiconductor device according to claim 1, wherein:

said plurality of word lines, said first and second common source lines, and said first and second power source supply lines are extended in a first direction; and said plurality of data lines are extended in a second direction.

9. A semiconductor device according to claim 8, comprising:

a plurality of third sense amplifiers each comprising a pair of MISFETs of a second conductivity type and arranged in parallel to said first sense amplifiers;

a third common source line where source nodes of said plurality of third sense amplifiers are commonly connected;

a third power source supply line extended in said first direction and for supplying a third power source to said plurality of third sense amplifiers;

a fourth switch provided between said third power source supply line and said third common source line;

a plurality of fourth sense amplifiers each comprising a pair of MISFETs of a second conductivity type and arranged in parallel to said second sense amplifiers;

a fourth common source line where source nodes of said plurality of fourth sense amplifiers are commonly connected;

a fourth power source supply line, extending in said first direction, for supplying a fourth power source to said plurality of fourth sense amplifiers; and a fifth switch provided between said fourth power source supply line and said fourth common source line.

10. A semiconductor device according to claim 9, wherein:

said third power source voltage is lower than said first power source voltage; and said fourth power source voltage is lower than said third power source voltage.

11. A semiconductor device according to claim 9, wherein:

a first region substantially rectangular in shape having an angle between intersecting first and second sides wherein said plurality of word lines, said plurality of data lines, and said plurality of memory cells are disposed in said first region;

a second region arranged along said first side and comprising said plurality of first, second, third and fourth sense amplifiers, said first, second, third and fourth power source supply lines, said first and second common source lines, and said plurality of second, third and fifth switches;

a third region arranged along said second side and comprising a plurality of connections between one of a plurality of word line driving circuits and one of said plurality of word lines; and a fourth region, sharing said angle of said first region, where said first and fourth switches are disposed and wherein said fourth region is enclosed by said second and third regions.

* * * * *